US010937502B2

(12) United States Patent
Hashimoto

(10) Patent No.: US 10,937,502 B2
(45) Date of Patent: Mar. 2, 2021

(54) SEMICONDUCTOR MEMORY DEVICE IN WHICH A CONDUCTIVE LINE CONNECTED TO A WORD LINE SELECTED FOR PROGRAMMING IS CHARGED TO A VOLTAGE LARGER THAN THE PROGRAM VOLTAGE

(71) Applicant: Toshiba Memory Corporation, Tokyo (JP)

(72) Inventor: Toshifumi Hashimoto, Fujisawa Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 16/546,112

(22) Filed: Aug. 20, 2019

(65) Prior Publication Data

US 2020/0286563 A1 Sep. 10, 2020

(30) Foreign Application Priority Data

Mar. 7, 2019 (JP) .............................. JP2019-041070

(51) Int. Cl.
| | | |
|---|---|---|
| G11C 16/06 | (2006.01) | |
| G11C 16/10 | (2006.01) | |
| G11C 16/32 | (2006.01) | |
| H01L 27/11526 | (2017.01) | |
| G11C 16/30 | (2006.01) | |
| G11C 16/04 | (2006.01) | |
| H01L 27/11573 | (2017.01) | |

(Continued)

(52) U.S. Cl.
CPC .......... *G11C 16/10* (2013.01); *G11C 16/0483* (2013.01); *G11C 16/30* (2013.01); *G11C 16/32* (2013.01); *G11C 16/3459* (2013.01); *H01L 27/11526* (2013.01); *H01L 27/11573* (2013.01); *H01L 27/11556* (2013.01); *H01L 27/11582* (2013.01)

(58) Field of Classification Search
CPC .................................................. G11C 16/3459
USPC .................................................... 365/185.22
See application file for complete search history.

(56) References Cited

U.S. PATENT DOCUMENTS 8,040,731 B2 10/2011 Hashimoto
10,008,270 B2 6/2018 Lee et al.
(Continued)

FOREIGN PATENT DOCUMENTS

JP 2013-191264 A 9/2013
JP 2015-176309 A 10/2015

*Primary Examiner* — Hoai V Ho
(74) *Attorney, Agent, or Firm* — Kim & Stewart LLP

(57) ABSTRACT

A semiconductor memory device includes a first memory transistor, a first wiring connected to a gate electrode of the first memory transistor, a connection transistor connected to the first wiring, and a second wiring connected to the connection transistor. In a first write operation for the first memory transistor, during a first time period, a voltage of the first wiring increases to a first voltage and a voltage of the second wiring increases to a second voltage larger than the first voltage, and during a second time period directly after the first time period and directly after the connection transistor is turned ON, the voltage of the first wiring increases to a third voltage larger than the first voltage and smaller than the second voltage, and the voltage of the second wiring decreases to a fourth voltage larger than the first voltage and smaller than the second voltage.

20 Claims, 15 Drawing Sheets

(51) Int. Cl.
*G11C 16/34* (2006.01)
*H01L 27/11582* (2017.01)
*H01L 27/11556* (2017.01)

(56) References Cited

U.S. PATENT DOCUMENTS

| | | |
|---|---|---|
| 10,120,584 B2 | 11/2018 | Shirakawa et al. |
| 2017/0206966 A1* | 7/2017 | Lee ................... G11C 16/0483 |
| 2020/0126622 A1* | 4/2020 | Utsumi .............. G11C 16/0483 |

* cited by examiner

SEMICONDUCTOR MEMORY DEVICE IN WHICH A CONDUCTIVE LINE CONNECTED TO A WORD LINE SELECTED FOR PROGRAMMING IS CHARGED TO A VOLTAGE LARGER THAN THE PROGRAM VOLTAGE

CROSS-REFERENCE TO RELATED APPLICATION(S)

This application is based upon and claims the benefit of priority from Japanese Patent Application No. 2019-041070, filed Mar. 7, 2019, the entire contents of which are incorporated herein by reference.

FIELD

Embodiments described herein relate generally to a semiconductor memory device.

BACKGROUND

A semiconductor memory device which includes a memory transistor is known.

DETAILED DESCRIPTION

Embodiments provide a semiconductor memory device which operates at a high speed.

In general, according to one embodiment, a semiconductor memory device includes a first memory transistor, a first wiring connected to a gate electrode of the first memory transistor, a first connection transistor connected to the first wiring, and a second wiring connected to the first connection transistor. In a first write operation for the first memory transistor, during a first time period, a voltage of the first wiring increases to a first voltage and a voltage of the second wiring increases to a second voltage larger than the first voltage, and during a second time period directly after the first time period and directly after the first connection transistor is turned ON, the voltage of the first wiring increases to a third voltage larger than the first voltage and smaller than the second voltage, and the voltage of the second wiring decreases to a fourth voltage larger than the first voltage and smaller than the second voltage.

Next, a semiconductor memory device according to an embodiment will be described in detail with reference to the accompanying drawings. The following embodiment is merely an example and is not described to limit the present disclosure. Further, the following drawings are schematic and for convenience of description, some parts may not be illustrated. In addition, descriptions of parts which are common to plural embodiments are not repeated.

In the present specification, the phrase "semiconductor memory device" may refer to a memory die or a memory system that includes a control die such as a memory chip, a memory card, and an SSD. Further, the phrase "semiconductor memory device" may refer to a configuration that includes a host computer such as a smart phone, a tablet terminal, and a personal computer.

In the present specification, when a first element is said to be "electrically connected" to a second configuration, the first element may be directly connected to the second element or the first element may be connected to the second element via a wiring, a semiconductor member, or a transistor. For example, when three transistors are connected to each other in series, a first transistor is "electrically connected" to a third transistor even when a second transistor is in an OFF state.

In the present specification, a case where the first element is "connected between" the second element and the third element may indicate that the first, second, and third elements are connected to each other in series and the first element is provided on current paths of the second and third elements.

In the present specification, a case where a circuit, etc. "conducts" two wirings, etc. may indicate, for example, that the circuit, etc. includes the transistor, etc. the transistor, etc. is provided on a current path between two wirings, and the transistor, etc. is in an ON state.

First Embodiment

[Configuration]

Figure 1:
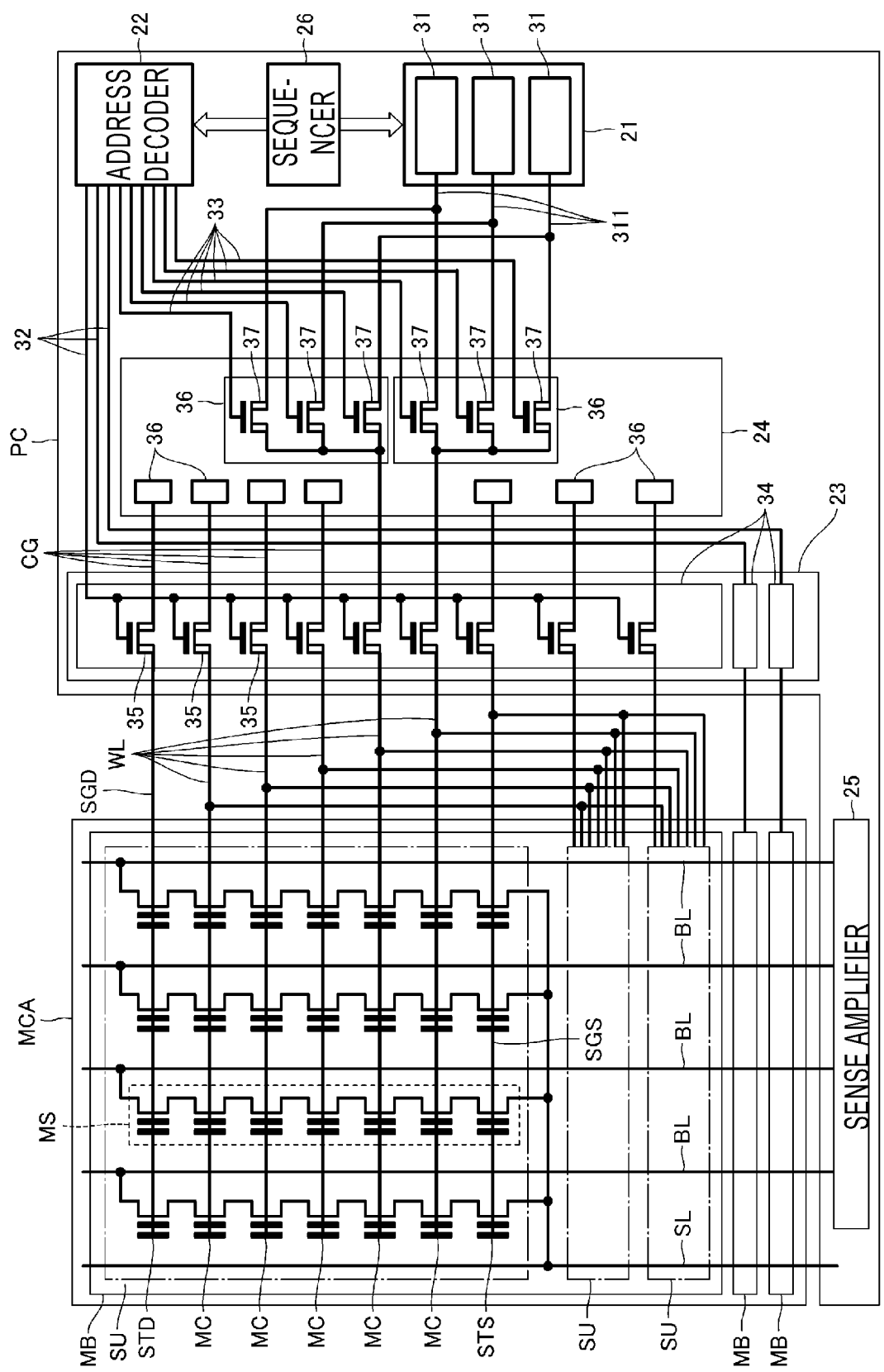
FIG. 1 is a schematic block diagram illustrating a configuration of a semiconductor memory device according to a first embodiment.

FIG. 1 is a schematic equivalent circuit diagram illustrating a configuration of a semiconductor memory device according to a first embodiment.

The semiconductor memory device according to the embodiment includes a memory cell array MCA and a peripheral circuit PC that controls the memory cell array MCA.

The memory cell array MCA includes plural memory blocks MB. Each of the plural memory blocks MB includes plural string units SU. Each of the plural string units SU includes plural memory strings MS. One end of each of the plural memory strings MS is connected to the peripheral circuit PC via a bit line BL. Further, the other end of each of the plural memory strings MS is connected to the peripheral circuit PC via a common source line SL.

The memory string MS includes a drain select transistor STD which is connected in series between the bit line BL and the source line SL, plural memory cells MC which are connected in series, and a source select transistor STS. Hereinafter, the drain select transistor STD and the source select transistor STS may be simply referred to as select transistors STD and STS.

The memory cell MC is a field effect transistor that includes a semiconductor pillar functioning as a channel region, a gate insulating film that includes a charge storage film, and a gate electrode. A threshold voltage of the memory cell MC varies in accordance with a charge amount in the charge storage film. Further, a word line WL is connected to each of the gate electrodes of the plural memory cells MC which corresponds to one memory string MS. Each word line WL is commonly connected to all memory strings MS in one memory block MB.

The select transistors STD and STS are field effect transistors that include a semiconductor pillar functioning as the channel region, the gate insulating film, and the gate electrode. Select gate lines SGD and SGS are connected to the gate electrodes of the select transistors STD and STS, respectively. A drain select line SGD is provided to correspond to the string unit SU and is commonly connected to all memory strings MS in one string unit SU. A source select line SGS is commonly connected to all memory strings MS in one memory block MB.

The peripheral circuit PC includes an operating voltage generation module 21 that generates an operating voltage, an address decoder 22 that decodes address data, and a block select circuit 23 and a voltage select circuit 24 that transmit the operating voltage to the memory cell array MCA according to an output signal of the address decoder 22, a sense amplifier 25 that is connected to the bit line BL, and a sequencer 26 that controls the operating voltage generation module 21, the address decoder 22, the block select circuit 23, the voltage select circuit 24, and the sense amplifier 25.

The operating voltage generation module 21 includes plural operating voltage generation units 31. For example, a ground voltage and a power supply voltage are supplied to the plural operating voltage generation units 31. Further, each of the plural operating voltage generation units 31 sequentially generates the operating voltage applied to the bit line BL, the source line SL, the word line WL, and the select gate lines SGD and SGS, and outputs the generated operating voltage to the plural operating voltage output terminals 311 during a read operation, a write operation, and an erase operation for the memory cell array MCA according to a control signal from the sequencer 26.

The address decoder 22 includes plural block select lines 32 and plural voltage select lines 33. For example, the address decoder 22 refers to address data of an address register sequentially in accordance with the control signal from the sequencer 26, decodes the address data, causes a predetermined block select line 32 and a predetermined voltage select line 33 corresponding to the address data to be in an "H" state, and causes other block select line 32 and voltage select line 33 to be in an "L" state.

The block select circuit 23 includes plural block select units 34 corresponding to the memory block MB. The plural block select units 34 include plural block select transistors 35 corresponding to the word line WL and the select gate lines SGD and SGS, respectively. The block select transistor 35 is, for example, a field effect type high-breakdown voltage transistor. One end of each block select transistor 35 is electrically connected to the corresponding word line WL or select gate lines SGD and SGS. The other end of each block select transistor 35 is electrically connected to the operating voltage output terminal 311 via a wiring CG and the voltage select circuit 24. The gate electrode is commonly connected to the corresponding block select line 32.

The voltage select circuit 24 includes plural voltage selection units 36 corresponding to the word line WL and the select gate lines SGD and SGS. The plural voltage selection units 36 include plural voltage select transistors 37, respectively. The voltage select transistor 37 is, for example, the field effect type high-breakdown voltage transistor. One end of each voltage select transistor 37 is electrically connected to the corresponding word line WL or select gate lines SGD and SGS via the wiring CG and the block select circuit 23. The other end of each voltage select transistor 37 is electrically connected to the corresponding operating voltage output terminal 311. The gate electrodes are connected to the corresponding voltage select lines 33, respectively.

The sense amplifier 25 is connected to plural bit lines BL. The sense amplifier 25 includes, for example, plural sense amplifier units corresponding to the bit line BL. Each sense amplifier unit includes a clamp transistor that supplies a voltage and a current to the bit line BL based on the voltage generated by the operating voltage generation module 21, a sense circuit that senses the voltage or the current of the bit line BL, plural latches that hold an output signal or write data of the sense circuit, a verify pass flag, etc. and a logic circuit. The logic circuit specifies data held in the memory cell MC by referring to the data held in the latch during, for example, the read operation. Further, for example, the voltage of the bit line BL is controlled by referring to the data held in the latch during the write operation.

The sequencer 26 outputs the control signal to the operating voltage generation module 21, the address decoder 22, and the sense amplifier 25 according to an input command and a state of a semiconductor memory device. For example, the sequencer 26 refers to command data of a command register sequentially according to a clock signal, decodes the command data, and outputs the decoded command data to the operating voltage generation module 21, the address decoder 22, and the sense amplifier 25.

Figure 2:
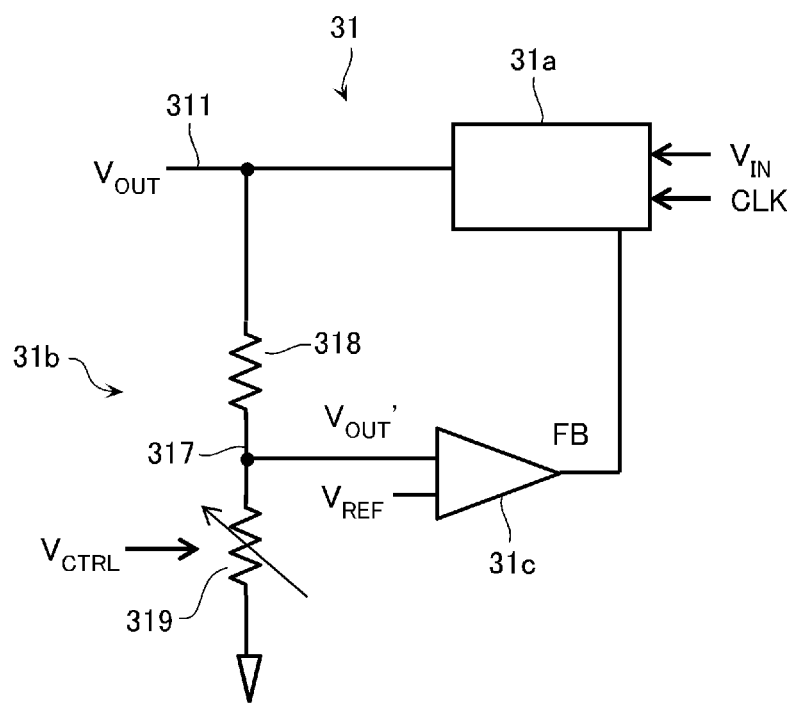
FIGS. 2-4 are each a schematic circuit diagram illustrating a configuration of a part of the semiconductor memory device according to the first embodiment.
Figure 3:
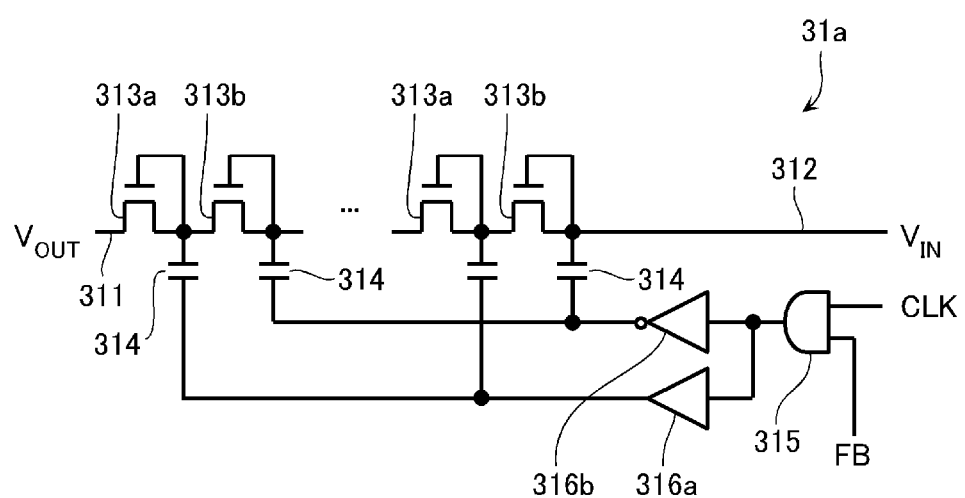
Figure 4:
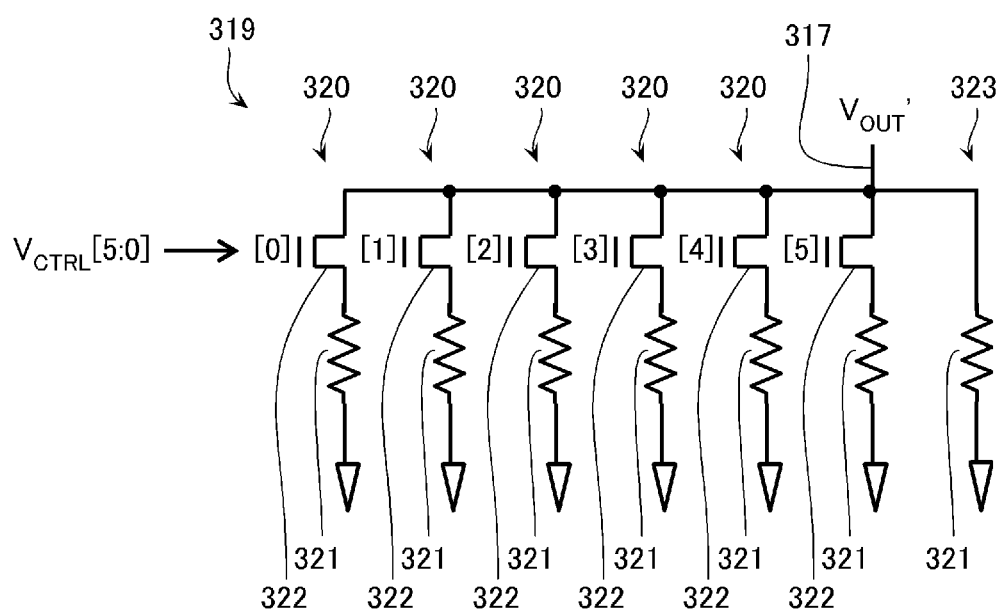

FIGS. 2 to 4 are schematic equivalent circuit diagrams each illustrating a configuration of the operating voltage generation unit 31.

As illustrated in FIG. 2, the operating voltage generation unit 31 includes a booster circuit 31a that outputs a voltage $V_{OUT}$ to the operating voltage output terminal 311, a voltage dividing circuit 31b that is connected to the operating voltage output terminal 311, and a comparator 31c that outputs a feedback signal FB to the booster circuit 31a according to a magnitude relationship between a voltage $V_{OUT}'$ output from the voltage dividing circuit 31b and a reference voltage $V_{REF}$.

As illustrated in FIG. 3, the booster circuit 31a includes plural transistors 313a and 313b that are alternately connected between a power supply voltage input terminal 312 and an operating voltage output terminal 311. A power voltage is supplied to the power voltage input terminal 312. The gate electrodes of the plural transistors 313a and 313b connected in series are connected to each drain electrode and a capacitor 314. Further, the booster circuit 31a includes an AND circuit 315 that outputs a logical sum of a clock signal CLK and the feedback signal FB, a level shifter 316a that boosts and outputs an output signal of the AND circuit 315, and a level shifter 316b that boosts and outputs an inverted signal of the output signal of the AND circuit 315. The output signal of the level shifter 316a is connected to the gate electrode of the transistor 313a via the capacitor 314. The output signal of the level shifter 316b is connected to the gate electrode of the transistor 313b via the capacitor 314.

When the feedback signal FB is in the "H" state, the clock signal CLK is output from the AND circuit 315. Along with this, electrons are transferred from the operating voltage output terminal 311 to the power supply voltage input terminal 312, and the voltage of the operating voltage output terminal 311 increases. Meanwhile, when the feedback signal FB is in the "L" state, the clock signal CLK is not output from the AND circuit 315. Accordingly, the voltage of the operating voltage output terminal 311 does not increase.

The voltage dividing circuit 31b (FIG. 2) includes a resistance element 318 that is connected between the operating voltage output terminal 311 and the voltage dividing terminal 317, and a variable resistance element 319 that is connected in series between the voltage dividing terminal 317 and a ground terminal. A resistance value of the variable resistance element 319 is adjustable in accordance with an operating voltage control signal $V_{CTRL}$. Accordingly, a magnitude of the voltage $V_{OUT}'$ output from the voltage dividing terminal 317 is adjustable according to the operating voltage control signal $V_{CTRL}$.

As illustrated in FIG. 4, the variable resistance element 319 includes plural current paths 320 that are connected in parallel between the voltage dividing terminal 317 and the ground terminal. Each of the plural current paths 320 includes a resistance element 321 and a transistor 322 that are connected in series. The resistance values of the resistance elements 321 that are provided in respective current paths 320 may have different magnitudes. Different bits of the operating voltage control signals $V_{CTRL}$ are input into the gate electrodes of the transistors 322 provided in the respective current paths 320, respectively. Further, the variable resistance element 319 may have a current path 323 that does not include the transistor 322.

The comparator 31c (FIG. 2) outputs the feedback signal FB. The feedback signal FB goes into the "L" state, for example, when the voltage $V_{OUT}'$ of the voltage dividing terminal 317 is larger than the reference voltage $V_{REF}$. Further, the feedback signal FB goes into the "H" state, for example, when the voltage $V_{OUT}$ is smaller than the reference voltage $V_{REF}$.

Figure 5:
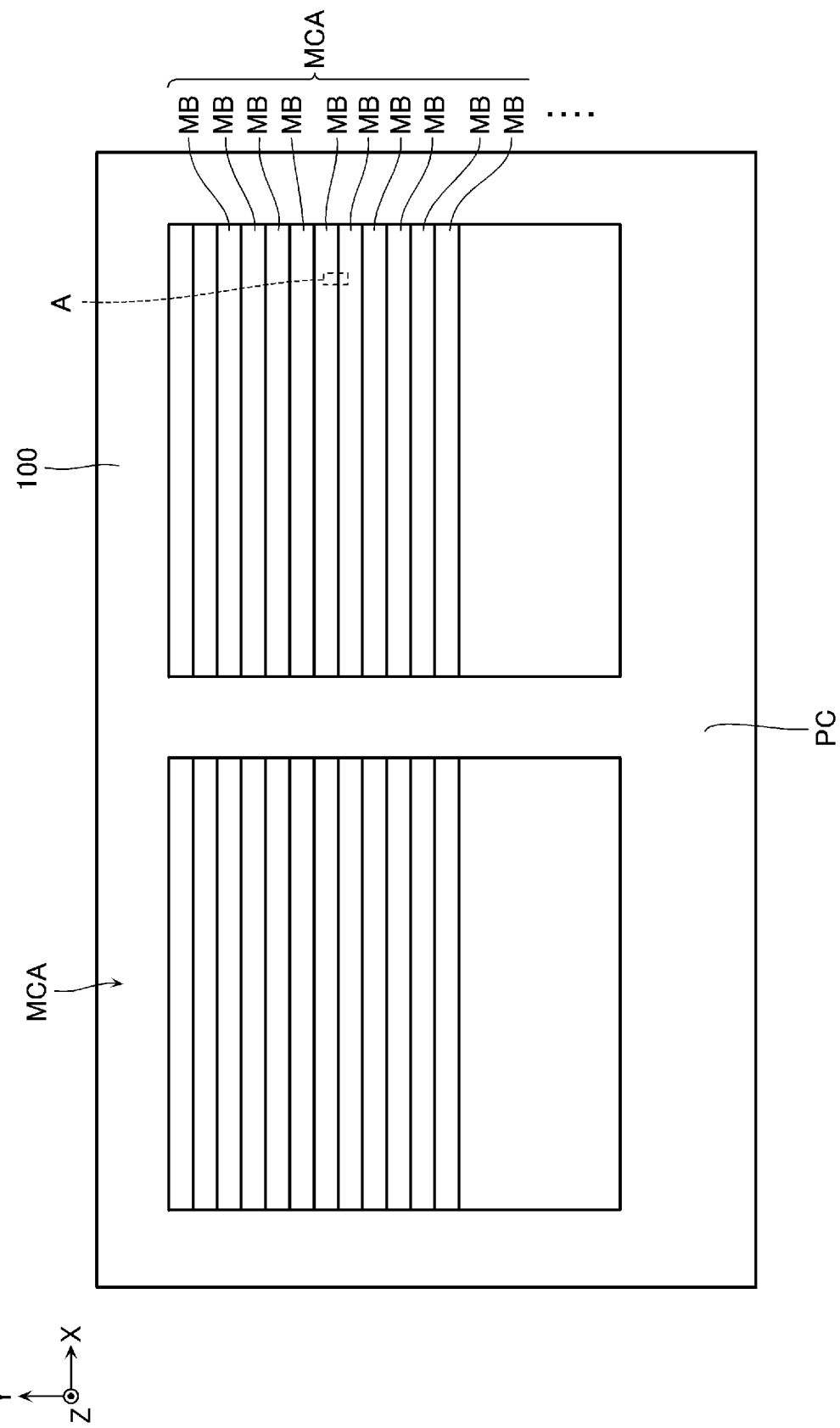
FIG. 5 is a schematic plan view illustrating a configuration of a part of the semiconductor memory device according to the first embodiment.

FIG. 5 is a schematic plan view of the semiconductor memory device according to the embodiment. The semiconductor memory device according to the present embodiment includes a substrate 100. Further, two memory cell arrays MCA aligned in an X direction are provided on the substrate 100. The memory cell array MCA includes plural memory blocks MB disposed in a Y direction. Further, the peripheral circuit PC is provided in an area outside the memory cell array MCA.

Figure 6:
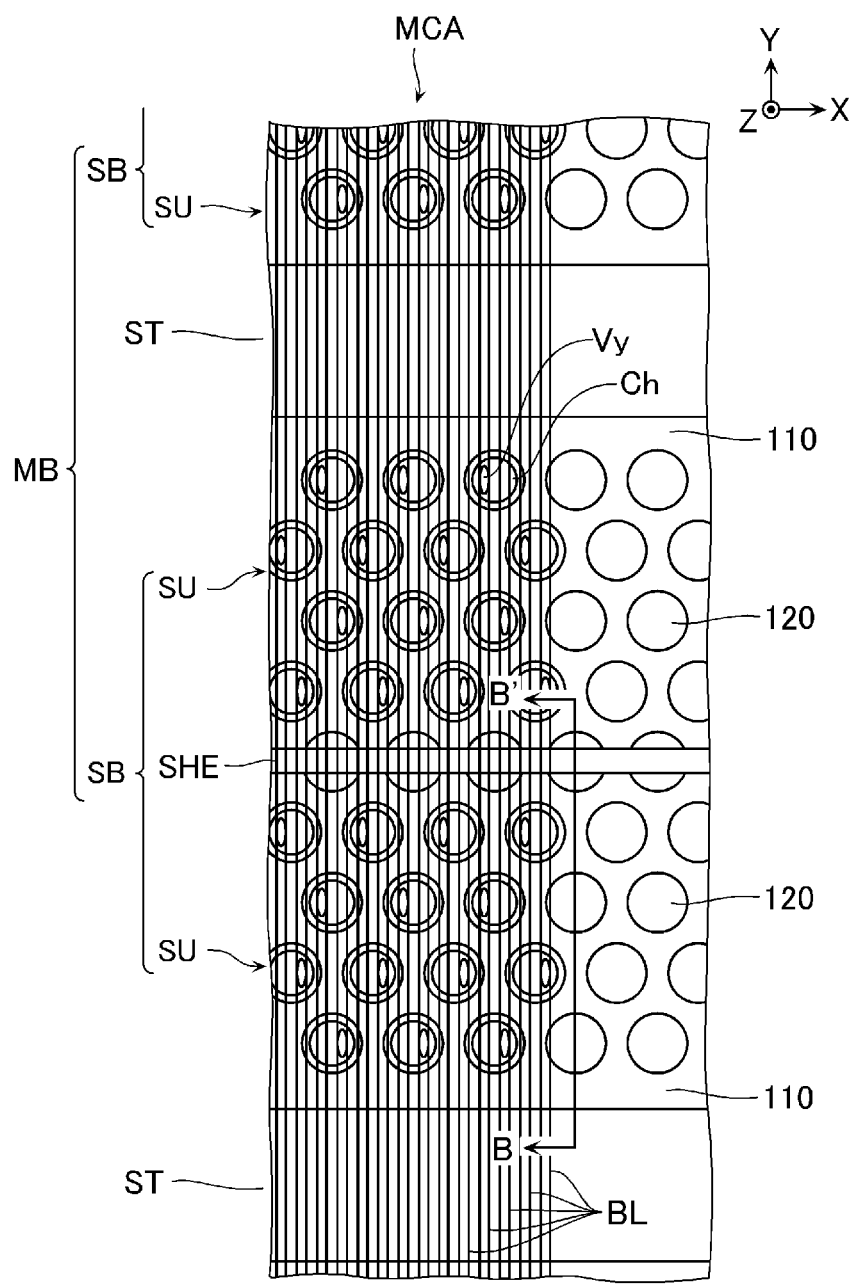
FIG. 6 is a schematic enlarged diagram of a part represented by the symbol "A" of FIG. 5.

FIG. 6 is an enlarged diagram of a part represented by the symbol "A" of FIG. 5. In the embodiment, the memory cell array MCA includes plural sub-block structures SB that are separated in the Y direction by dividing grooves ST which extend in the X direction. The memory block MB is constituted by two sub-block structures SB arranged in the Y direction. A dividing groove SHE which extends in the X direction is formed in each sub-block structure SB, and two string units SU arranged in the Y direction are formed in each sub-block structure SB by the dividing groove SHE. Further, each sub-block structure SB includes a conductive layer 110 and plural semiconductor pillars 120 which are disposed in a zigzag shape. Further, FIG. 6 illustrates plural bit lines BL which are arranged in the X direction and extend in the Y direction. Each bit line BL extends in the Y direction and is connected to one semiconductor pillar 120 corresponding to each string unit SU.

Figure 7:
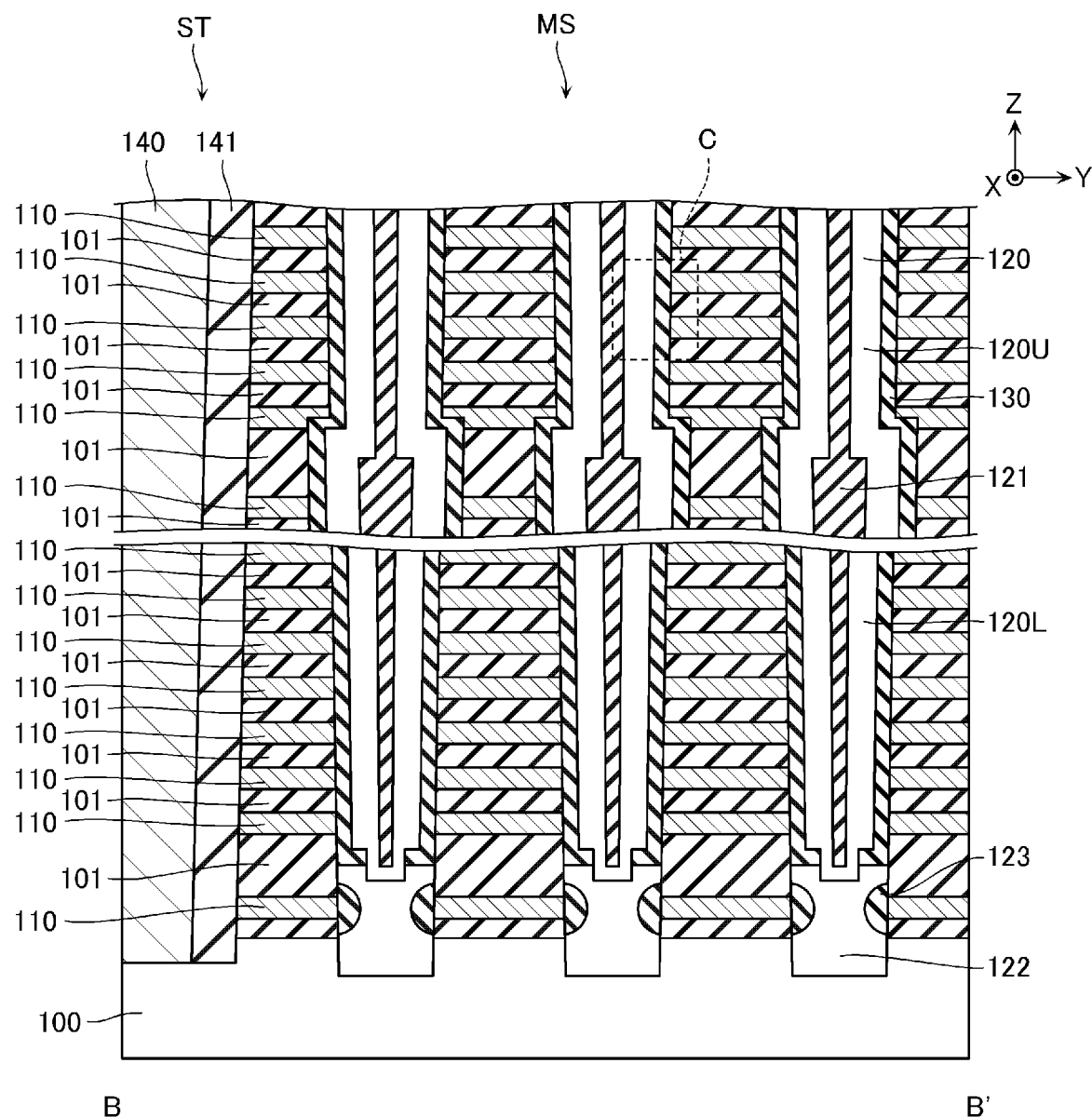
FIG. 7 is a schematic cross-sectional view of a configuration illustrated in FIG. 6 which is taken along line B-B' and viewed in a direction of an arrow.
Figure 8:
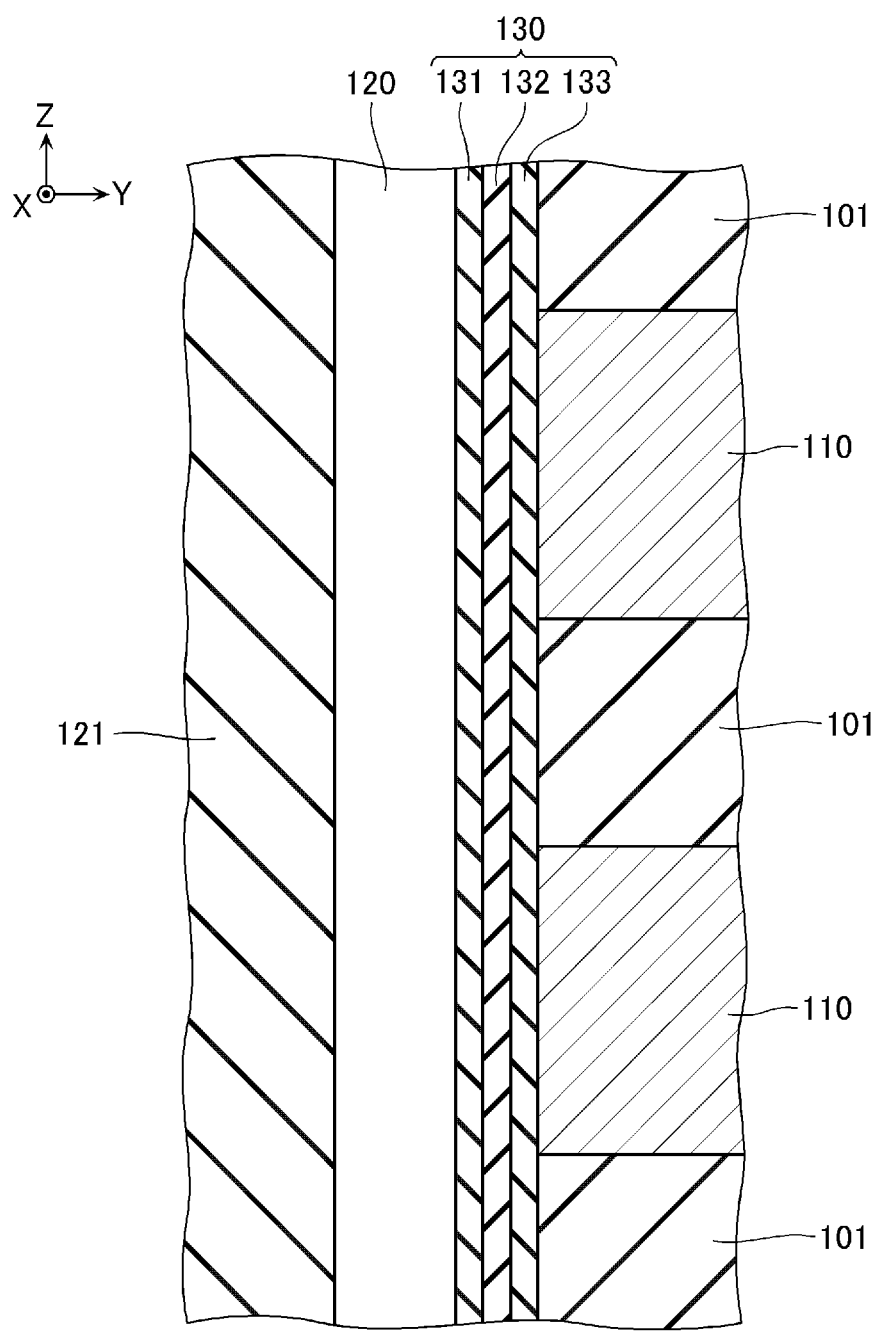
FIG. 8 is a schematic enlarged diagram of a part represented by the symbol "C" of FIG. 7.

FIG. 7 is a schematic cross-sectional view of a structure illustrated in FIG. 6 which is taken along line B-B' and viewed in a direction of the arrow. FIG. 8 is a schematic enlarged diagram of a part represented by the symbol "C" of FIG. 7. As illustrated in FIG. 7, the semiconductor memory device according to the embodiment includes a substrate 100, plural conductive layers 110 that are arranged in a Z direction, plural semiconductor pillars 120 that extend in the Z direction, plural gate insulating films 130 that are provided between the plural conductive layers 110 and the plural semiconductor pillars 120, respectively, and a conductive layer 140 that is connected to the substrate 100.

The substrate 100 is, for example, a semiconductor substrate such as single crystal silicon (Si) containing a P-type impurity. An N-type well containing an N-type impurity such as phosphorous (P) is provided on a part of the surface of the substrate 100. Further, a P-type well containing a P-type impurity such as boron (B) is provided on a part of the surface of the N-type well.

The conductive layer 110 is a substantially plate-like conductive layer that extends in the X direction and plural conductive layers 110 are arranged in the Z direction. The conductive layer 110 may include a lamination film such as titanium nitride (TiN) and tungsten (W) or include a polycrystal silicon containing the impurity such as phosphorous or boron. Further, an insulating layer 101 such as silicon oxide (SiO$_2$) is provided between the conductive layers 110.

Figure 9:
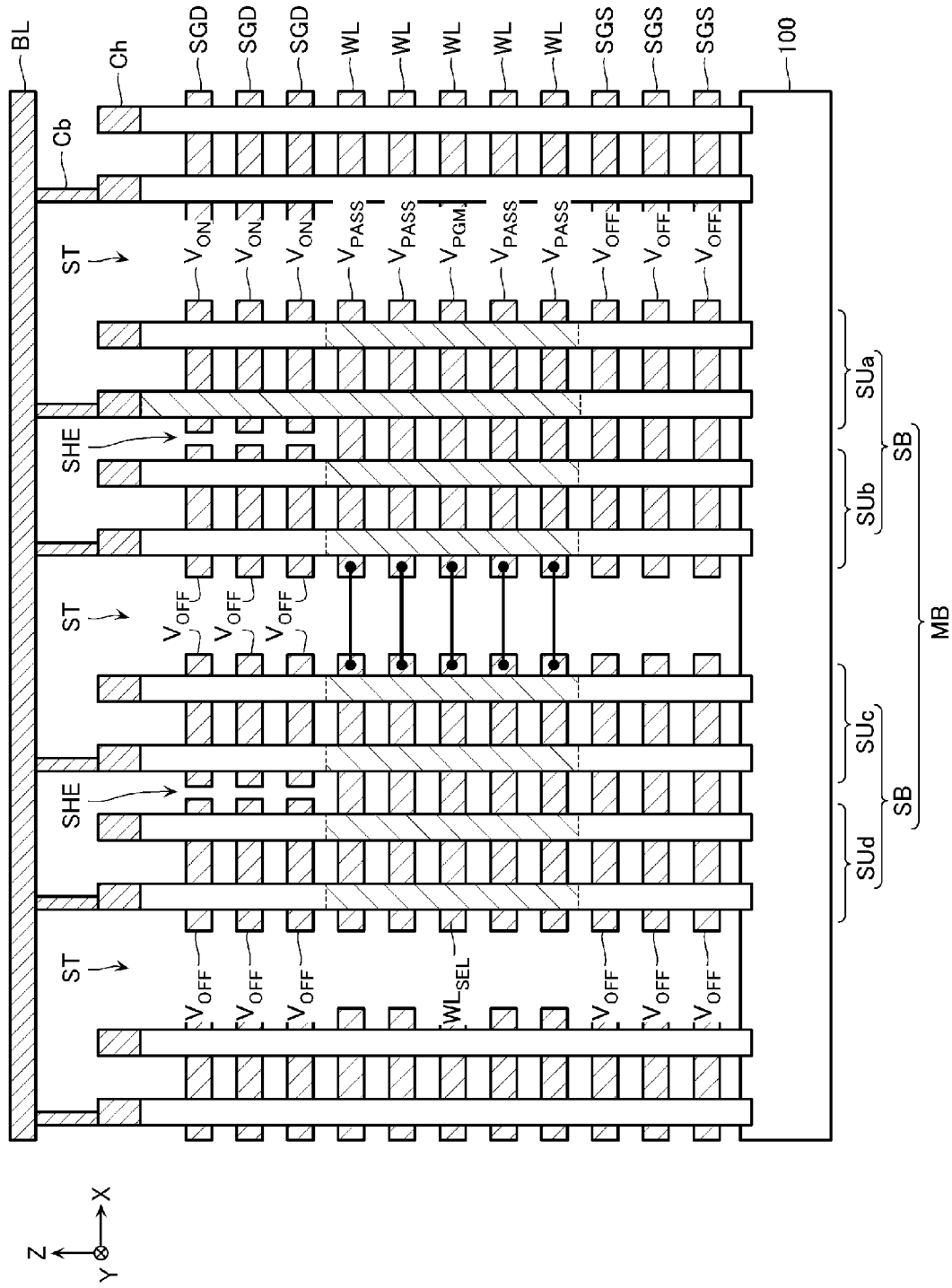
FIG. 9 is a schematic cross-sectional diagram for describing a write operation according to the first embodiment.

Among the plural conductive layers 110, one or more conductive layers 110 which are positioned on lowermost layers function as the source select line SGS (FIG. 1) and the gate electrodes of plural source select transistors STS which are connected thereto (FIG. 1). Further, the plural conductive layers 110 which are positioned above the conductive layers 110 described above function as the word lines WL (FIG. 1) and the gate electrodes of the plural memory cells MC which are connected thereto (FIG. 1). Further, one or more conductive layers 110 which are positioned above the conductive layers 110 described above function as the drain select line SGD (FIG. 1) and the gate electrodes of the plural drain select transistors STD which are connected thereto (FIG. 1). As illustrated in FIG. 9, a dividing groove ST that partitions the sub-block structure SB has a depth in the Z direction that separates all of the conductive layers 110. Further, the dividing groove SHE that partitions the string unit SU has a depth in the Z direction that separates the conductive layer 110 which functions as the drain select line SGD. In each memory block MB, each of the conductive layers 110 which functions as the word lines WL of two sub-block structures SB is connected. Therefore, four string units SU are formed in each memory block MB.

The semiconductor pillar 120 is, for example, a pillar shape body that is formed by a semiconductor film such as a undoped polycrystal silicon (Si). The semiconductor pillar 120 has a substantially cylindrical shape, and a central portion thereof is provided with a core portion 121 made of silicon oxide or the like. Further, an outer circumferential surface of the semiconductor pillar 120 is surrounded by the respective conductive layers 110. A lower end portion of the semiconductor pillar 120 is connected to the P-type well of the substrate 100 via a semiconductor base 122 such as an undoped single crystal silicon. The semiconductor base 122 faces the lowermost conductive layer 110 via an insulating layer 123 such as silicon oxide. An upper end portion of the semiconductor pillar 120 is connected to the bit line BL (FIG. 6) via contacts Ch and Vy (FIG. 6). Each semiconductor pillar 120 functions as the channel region for plural memory cells MC included in one memory string MS (FIG. 3) and the drain select transistor STD. The semiconductor base 122 functions as the channel region of a part of the source select transistor STS.

The semiconductor pillar 120 according to the embodiment includes a lower semiconductor pillar 120L and an upper semiconductor pillar 120U. The lower semiconductor pillar 120L and the upper semiconductor pillar 120U extend in the Z direction. The upper end portion of the lower semiconductor pillar 120L is connected to the lower end portion of the upper semiconductor pillar 120U. Outer diameters of the upper end portions of the lower semiconductor pillar 120L and the upper semiconductor pillar 120U in an XY plane are larger than the outer diameters of the lower end portions of the lower semiconductor pillar 120L and the upper semiconductor pillar 120U in the XY plane.

For example, as illustrated in FIG. 8, the gate insulating film 130 includes a tunnel insulating film 131, a charge storage film 132, and a block insulating film 133 which are stacked between the semiconductor pillar 120 and the conductive layer 110. The tunnel insulating film 131 and the block insulating film 133 are, for example, insulating films such as silicon oxide. The charge storage film 132 is, for example, a film that is capable of storing charges, such as silicon nitride (SiN). The tunnel insulating film 131, the charge storage film 132, and the block insulating film 133 have a substantially cylindrical shape, and extend in the Z direction along the outer peripheral surface of the semiconductor pillar 120.

FIG. 8 illustrates an example in which the gate insulating film 130 includes the charge storage film 132 such as silicon nitride, but the gate insulating film 130 of another example may include a floating gate such as a polycrystal silicon containing the N-type or P-type impurity.

For example, as illustrated in FIG. 7, the conductive layer 140 is provided in the dividing groove ST. The conductive layer 140 extends in the X and Z directions and functions as the source line SL. The conductive layer 140 may include, for example, a stacked film of titanium nitride and tungsten. An insulating layer 141 such as silicon oxide is provided between the conductive layer 140 and the plural conductive layers 110.

[Write Operation]

Figure 10:
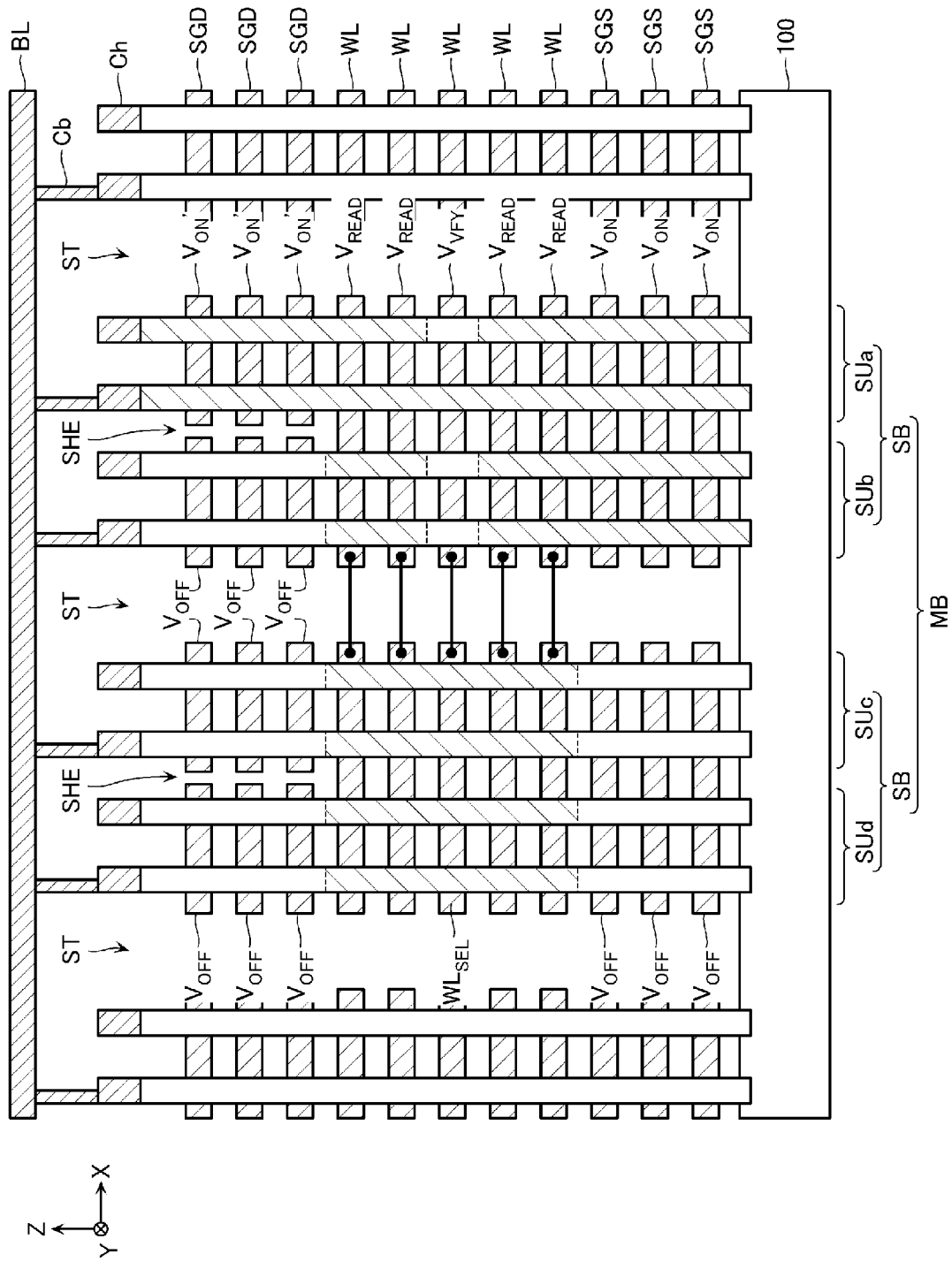
FIG. 10 is a schematic cross-sectional diagram for describing the write operation according to the first embodiment.

Next, the write operation of the semiconductor memory device according to the first embodiment will be briefly described with reference to FIGS. 9 and 10. FIGS. 9 and 10 are schematic cross-sectional views for describing a program operation and a verify operation of the write operation, respectively. Further, FIGS. 9 and 10 illustrate four string units SU that are included in the memory block MB, which is a target of the write operation, as string units SUa, SUb, SUc, and SUd, respectively. In addition, FIGS. 9 and 10 illustrate an example in which the write operation is performed on the memory cell MC included in the string unit SUa. Further, in the following description, the word line WL connected to the selected memory cell MC may be referred to as a "selected word line $WL_{SEL}$". In addition, the other word lines WL may be referred to as "non-selected word lines WL". Further, among the selected memory cells MC, a selected memory cell MC in which a threshold voltage adjustment is performed is referred to as a "write memory cells MC", and a selected memory cell MC in which a threshold voltage adjustment is not performed is referred to as an "inhibited memory cell MC".

As illustrated in FIG. 9, in a program operation, for example, among the plural memory cells MC that are included in the string unit SUa and connected to the selected word line $WL_{SEL}$ (selected memory cell MC), different voltages are supplied to the bit line BL connected to the write memory cell MC and the bit line BL connected to the inhibited memory cell MC. For example, a ground voltage is supplied to the bit line BL corresponding to the write memory cell MC and a predetermined write inhibition voltage is supplied to the bit line BL corresponding to the inhibited memory cell MC.

In the program operation, the write memory cell MC is selectively conducted to the bit line BL. For example, an ON voltage $V_{ON}$ is supplied to the drain select line SGD corresponding to the string unit SUa. The ON voltage $V_{ON}$ has magnitudes, for example, at which the drain select transistor STD connected to the bit line BL to which the ground voltage is supplied goes into the ON state and the drain select transistor STD connected to the bit line BL to which write inhibition voltage is supplied goes into the OFF state. Further, an OFF voltage $V_{OFF}$ is supplied to the drain select line SGD corresponding to the string unit SUb, SUc, or SUd. The OFF voltage $V_{OFF}$ has a magnitude, for example, at which the drain select transistor STD goes into the OFF state. Further, a write pass voltage $V_{PASS}$ is supplied to the non-selected word line WL. The write pass voltage $V_{PASS}$ has a magnitude, for example, at which the memory cell MC goes into the ON state regardless of data written to the memory cell MC. The write pass voltage $V_{PASS}$ is larger than, for example, the power supply voltage.

In the program operation, a program voltage $V_{PGM}$ is supplied to the selected word line $WL_{SEL}$. The program voltage $V_{PGM}$ is larger than the write pass voltage $V_{PASS}$. Thus, electrons are stored in the charge storage film 132 of the write memory cell MC (FIG. 8), and the threshold voltage of the write memory cell MC is increased.

As illustrated in FIG. 10, in the verify operation, for example, among the plural memory cells MC that are included in the string unit SUa and connected to the selected word line $WL_{SEL}$ (selected memory cell MC), different voltages are supplied to the bit line BL connected to the write memory cell MC and the bit line BL connected to the inhibited memory cell MC. For example, a predetermined read bit line voltage is supplied to the bit line BL corresponding to the write memory cell MC and a ground voltage is supplied to the bit line BL corresponding to the inhibited memory cell MC.

In the verify operation, the memory cell MC that is included in the string unit SUa and connected to the selected word line $WL_{SEL}$ is selectively conducted to the bit line BL and the source line SL. For example, an ON voltage $V_{ON}'$ is supplied to the drain select line SGD corresponding to the string unit SUa. The ON voltage $V_{ON}'$ has a magnitude, for example, at which the drain select transistor STD goes into the ON state. The ON voltage $V_{ON}'$ may be larger than, for example, the ON voltage $V_{ON}$. Further, the OFF voltage $V_{OFF}$ is supplied to the drain select line SGD corresponding to the string unit SUb, SUc, or SUd. Further, a read pass voltage $V_{READ}$ is supplied to the non-selected word line WL. The read pass voltage $V_{READ}$ has a magnitude, for example, at which the memory cell MC goes into the ON state regardless of data written to the memory cell MC. The read pass voltage $V_{READ}$ is, for example, larger than the power supply voltage and smaller than the write pass voltage $V_{PASS}$.

In the verify operation, a verify voltage $V_{VFY}$ is supplied to the selected word line $WL_{SEL}$. The verify voltage $V_{VFY}$ has a magnitude, for example, at which the write memory cell MC goes into the ON state when desired data is not written in the write memory cell MC, and the write memory cell MC goes into the OFF state when the desired data is written to the write memory cell MC. The verify voltage $V_{VFY}$ is smaller than the read pass voltage $V_{READ}$.

In the verify operation, it is determined whether the desired data is written to all write memory cells MC. For example, when a current does not flow on all bit lines BL connected to the write memory cell MC, a signal is output to indicate a verify pass. Meanwhile, when a current flows on any one of plural bit lines BL connected to the write memory cell MC, a signal is output to indicate a verify fail.

Figure 11:
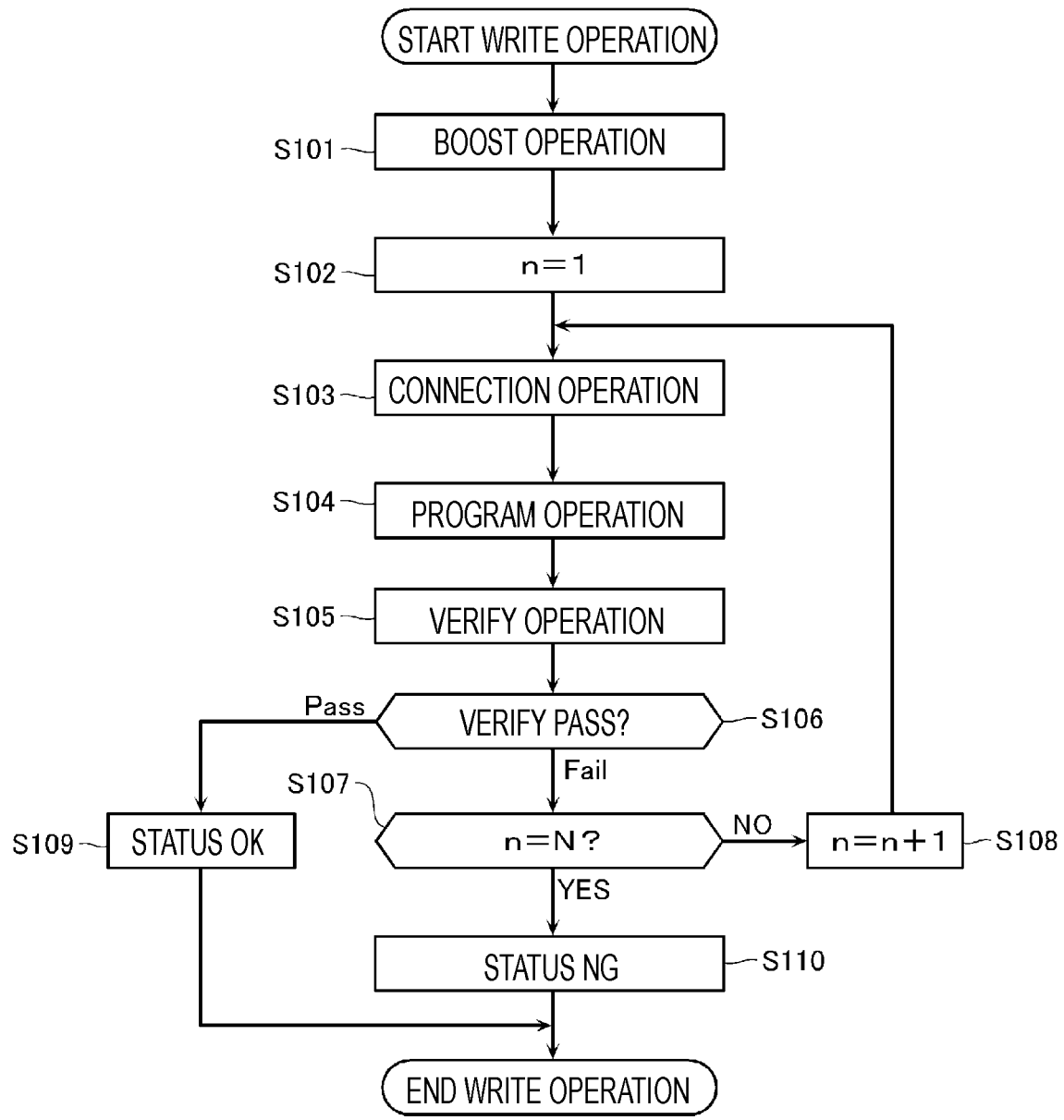
FIG. 11 is a schematic flowchart for describing the write operation according to the first embodiment.

FIG. 11 is a schematic flowchart for describing the write operation.

In step S101, a boost operation is performed. For example, an operating voltage control signal $V_{CTRL}$ (FIG. 2) and the clock signal CLK are input into to the booster circuit 31a (FIG. 2) so that the program voltage $V_{PGM}$, the write pass voltage $V_{PASS}$, the verify voltage $V_{VFY}$, the read pass voltage $V_{READ}$, and the like are generated by the plural operating voltage generation units 31. Further, in this state, the voltage select transistor 37 (FIG. 1) goes into the OFF state. Hereinafter, the operating voltage generation unit 31 that outputs the program voltage $V_{PGM}$ may be described as the "operating voltage generation unit 31 ($V_{PGM}$)". Similarly, each operating voltage generation unit 31 that outputs the write pass voltage $V_{PASS}$ may be described as the "operating voltage generation unit 31 ($V_{PASS}$)".

In step S102, a loop number n is set to one. The loop number n is recorded in a register or the like.

In step S103, a connection operation is performed. For example, the block select line 32 corresponding to the memory block MB that includes the selected memory cell MC goes into the "H" state. In addition, a predetermined voltage select line 33 goes into the "H" state. Along with this, the voltage $V_{OUT}$ output from the operating voltage generation unit 31 is supplied to the word line WL via the wiring CG and as described with reference to FIG. 9, the write memory cell MC is conducted with the bit line BL.

In the embodiment, in step S103, the voltage $V_{OUT}$ output from the operating voltage generation unit 31 ($V_{PGM}$) is increased to a voltage larger than the program voltage $V_{PGM}$.

In step S104, the program operation is performed. For example, the operating voltage output terminal 311 of the operating voltage generation unit 31 ($V_{PASS}$) is disconnected from the selected word line $WL_{SEL}$ and the operating voltage output terminal 311 of the operating voltage generation unit 31 ($V_{PGM}$) is conducted with the selected word line $WL_{SEL}$. Further, the voltage $V_{OUT}$ output from the operating voltage generation unit 31 ($V_{PGM}$) is decreased to the program voltage $V_{PGM}$. Thus, as described with reference to FIG. 9, the program voltage $V_{PGM}$ is supplied to the selected word line $WL_{SEL}$.

In step S105, the verify operation is performed. The verify operation is performed as described with reference to, for example, FIG. 10.

In step S106, it is determined whether the desired data is written to all write memory cells MC. The determination is performed as described with reference to, for example, FIG. 10. In the case of the verify fail, the process proceeds to step S107 and in the case of the verify pass, the process proceeds to step S109.

In step S107, it is determined whether the loop number n reaches a predetermined number N. When it is determined that the loop number n has not reached the predetermined number N, the process proceeds to step S108. When it is determined that the loop number n has reached the predetermined number N, the process proceeds to step S110.

In step S108, "1" is added to the loop number n. Further, the operating voltage control signal $V_{CTRL}$ (FIG. 2) is controlled to increase the voltage $V_{OUT}$ of the operating voltage generation unit 31 ($V_{PGM}$). Then, the process proceeds to step S102.

In step S109, status data is output to indicate that the write operation has ended normally, and the write operation ends.

In step S110, status data is output to indicate that the write operation did not end normally, and the write operation ends.

Figure 12:
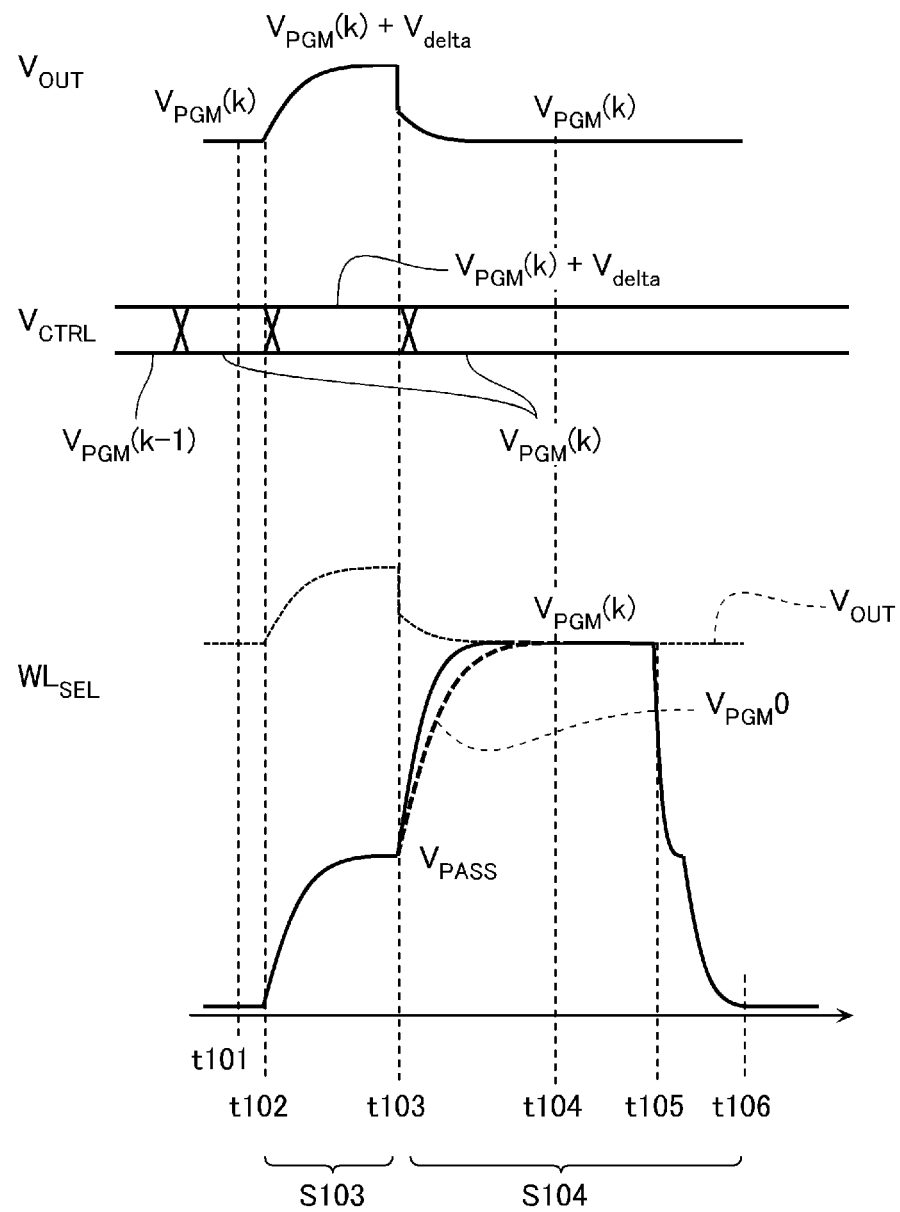
FIG. 12 is a schematic waveform diagram for describing the write operation according to the first embodiment.

FIG. 12 is a schematic waveform diagram for describing the write operation. FIG. 12 illustrates the voltage $V_{OUT}$ of the operating voltage output terminal 311 of the operating voltage generation unit 31 ($V_{PGM}$), the operating voltage control signal $V_{CTRL}$, and the voltage of the selected word line $WL_{SEL}$ in steps S103 and S104 of FIG. 11. Further, in FIG. 12, the program voltage $V_{PGM}$ is described as $V_{PGM}(k)$. The reason is that the program voltage $V_{PGM}$ is increased along with the increase in the loop number n and $V_{PGM}(k)$ refers to the program voltage $V_{PGM}$ when the loop number n is k.

At a timing t101, the voltage of the selected word line $WL_{SEL}$ has a magnitude of approximately the ground voltage. Further, the operating voltage control signal $V_{CTRL}$ has a value corresponding to the program voltage $V_{PGM}(k)$. In addition, the voltage $V_{OUT}$ of the operating voltage generation unit 31 ($V_{PGM}$) has a magnitude of approximately the program voltage $V_{PGM}(k)$.

At a timing t102, the connection operation (S103) is started. For example, the selected word line $WL_{SEL}$ is conducted with the operating voltage generation unit 31 ($V_{PASS}$). Further, a value of the operating voltage control signal $V_{CTRL}$ is switched to a value corresponding to a voltage larger than the program voltage $V_{PGM}(k)$ by a voltage $V_{delta}$.

From the timing t102 to a timing t103, the voltage of the selected word line $WL_{SEL}$ is increased to approximately the write pass voltage $V_{PASS}$. In addition, the voltage $V_{OUT}$ of the operating voltage generation unit 31 ($V_{PGM}$) is increased up to approximately the program voltage $V_{PGM}(k)$+the voltage $V_{delta}$. Accordingly, at a predetermined time between the timing t102 and the timing t103, the voltage of the selected word line $WL_{SEL}$ is larger than the ground voltage and equal to or smaller than the write pass voltage $V_{PASS}$. In addition, the voltage $V_{OUT}$ the operating voltage generation unit 31 ($V_{PGM}$) is larger than the program voltage $V_{PGM}(k)$ and equal to or smaller than the program voltage $V_{PGM}(k)$+the voltage $V_{delta}$.

At the timing t103, the connection operation (S104) is started. For example, the selected word line $WL_{SEL}$ is conducted with the operating voltage generation unit 31 ($V_{PGM}$). Along with this, the voltage $V_{OUT}$ of the operating voltage generation unit 31 ($V_{PGM}$) is decreased. In addition, a value of the operating voltage control signal $V_{CTRL}$ input into the operating voltage generation unit 31 ($V_{PGM}$) is switched to a value corresponding to the program voltage $V_{PGM}(k)$.

From the timing t103 to a timing t104, the voltage of the selected word line $WL_{SEL}$ is increased to approximately the program voltage $V_{PGM}(k)$. In addition, the voltage $V_{OUT}$ of the operating voltage generation unit 31 ($V_{PGM}$) is decreased to approximately the program voltage $V_{PGM}(k)$. Accordingly, at a predetermined timing between the timing t103 and the timing t104, the voltage of the selected word line $WL_{SEL}$ is larger than the write pass voltage $V_{PASS}$ and equal to or smaller than the program voltage $V_{PGM}(k)$. In addition, the voltage $V_{OUT}$ of the operating voltage generation unit 31 ($V_{PGM}$) is smaller than the program voltage $V_{PGM}(k)$+the voltage $V_{delta}$ and equal to or larger than the program voltage $V_{PGM}(k)$.

At a timing t105, the selected word line $WL_{SEL}$ is disconnected from the operating voltage generation unit 31 ($V_{PGM}$).

From the timing t105 to a timing t106, the voltage of the selected word line $WL_{SEL}$ is decreased to approximately the ground voltage.

[Effects]

As described with reference to FIG. 7 and the like, the semiconductor memory device according to the embodiment includes plural conductive layers 110 that are arranged in the Z direction, semiconductor pillars 120 that extend in the Z direction and face the plural conductive layers 110, and a gate insulating film 130 that are provided therebetween and capable of storing the charges. In such a semiconductor memory device, high integration may be implemented by reducing the Z-direction widths of the conductive layer 110 and the insulating layer 101. Accordingly, the Z-direction widths of the conductive layer 110 and the insulating layer 101 are reduced. However, as the width in the Z direction of the conductive layer 110 is reduced, a wiring resistance in the conductive layer 110 is increased. Further, as the width in the Z direction of the insulating layer 101 is reduced, a parasitic capacitance in the conductive layer 110 is increased. Accordingly, along with the high integration of the semiconductor memory device, a time constant (RC time constant) in the conductive layer 110 tends to increase and a charging time required to stabilize the voltage of the conductive layer 110 to a desired value tends to increase. Therefore, it may be difficult to implement a high-speed operation of the semiconductor memory device.

In particular, in the write operation, the program voltage $V_{PGM}$ is supplied to the selected word line $WL_{SEL}$. The program voltage $V_{PGM}$ is the largest voltage among the voltages supplied to the conductive layer 110. Since a conductive layer 110 having a larger time constant is charged with the program voltage $V_{PGM}$, as represented by, for example, "$V_{PGM}0$" in FIG. 12, a time until the voltage of the selected word line $WL_{SEL}$ reaches the program voltage $V_{PGM}(k)$ may increase and it may be difficult to implement the high-speed program operation.

Therefore, in the embodiment, as described with reference to FIG. 12 and the like, the operating voltage generation unit 31 ($V_{PGM}$) is conducted with the selected word line $WL_{SEL}$ in a state where the voltage $V_{OUT}$ of the operating voltage generation unit 31 ($V_{PGM}$) is charged up to approximately $V_{PGM}(k)$+$V_{delta}$ at the timing t103. Thus, the selected word line $WL_{SEL}$ may be charged with $V_{PGM}(k)$+$V_{delta}$ larger than the program voltage $V_{PGM}(k)$ in an initial step when charging is started. Therefore, it is possible to implement the high-speed program operation by shortening the time for the voltage of the selected word line $WL_{SEL}$ to reach the program voltage $V_{PGM}(k)$.

When the voltage of the selected word line $WL_{SEL}$ is larger than the program voltage $V_{PGM}(k)$, charges equal to or more than a predetermined charge amount may be stored in the charge storage film 132 (FIG. 8) of the write memory cell MC and a write error may occur. Therefore, in the embodiment, at the timing t103, the value of the operating voltage control signal $V_{CTRL}$ input into the operating voltage generation unit 31 ($V_{PGM}$) is switched to the value corresponding to the program voltage $V_{PGM}(k)$ and the voltage of the selected word line $WL_{SEL}$ is prevented from becoming larger than the program voltage $V_{PGM}(k)$. Thus, an occurrence of the write error may be suppressed.

[Voltage $V_{delta}$]

The magnitude of the voltage $V_{delta}$ in FIG. 12 may be adjusted as appropriate. Hereinafter, this point will be described with reference to FIGS. 13 to 16. FIGS. 13 to 16 are schematic waveform diagrams, and a waveform indicated by the solid line indicates the voltage of the selected word line $WL_{SEL}$ and a waveform indicated by the dotted line indicates the voltage $V_{OUT}$ of the operating voltage generation unit 31 ($V_{PGM}$). Further, FIGS. 13 to 16 illustrate an example in which N of FIG. 11 is 5.

Figure 13:
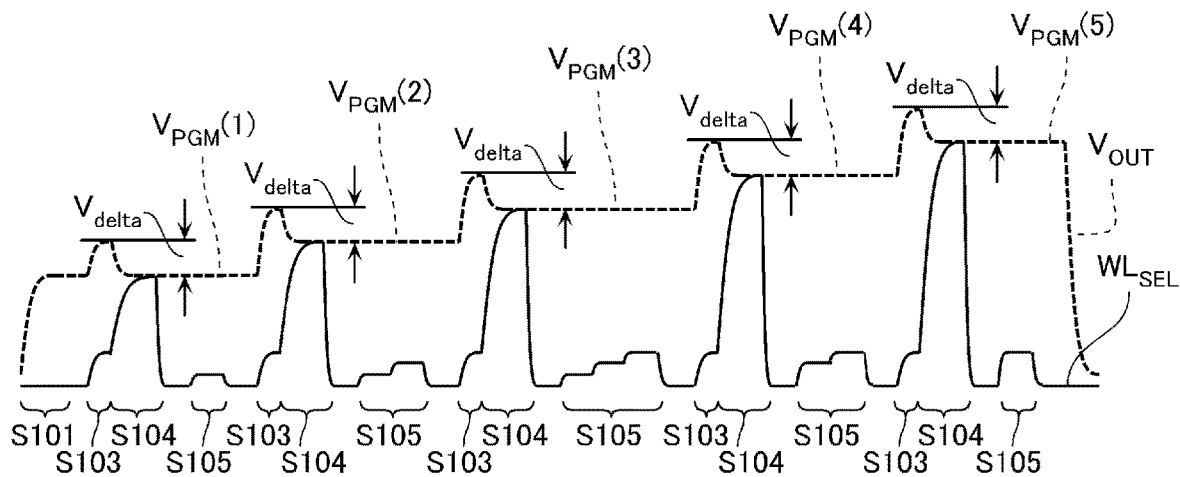
FIG. 13 is a schematic waveform diagram for describing the write operation according to the first embodiment.

As illustrated in FIG. 13, the magnitude of the voltage $V_{delta}$ may be a constant magnitude regardless of the loop number n. For example, when the loop number n is 1, the voltage $V_{OUT}$ of the operating voltage generation unit 31 ($V_{PGM}$) in step S103 may be increased to approximately the program voltage $V_{PGM}(1)$+the voltage $V_{delta}$ and decreased to the magnitude of approximately the program voltage $V_{PGM}(1)$ in step S104. Further, for example, when the loop number n is 2, the voltage $V_{OUT}$ of the operating voltage generation unit 31 ($V_{PGM}$) in step S103 may be increased to approximately the program voltage $V_{PGM}(2)$+the voltage $V_{delta}$ and decreased to the magnitude of approximately the program voltage $V_{PGM}(2)$ in step S104. Hereinafter, similarly, the loop number n may be increased to 3 to 5 and a subsequent operation may be executed.

Figure 14:
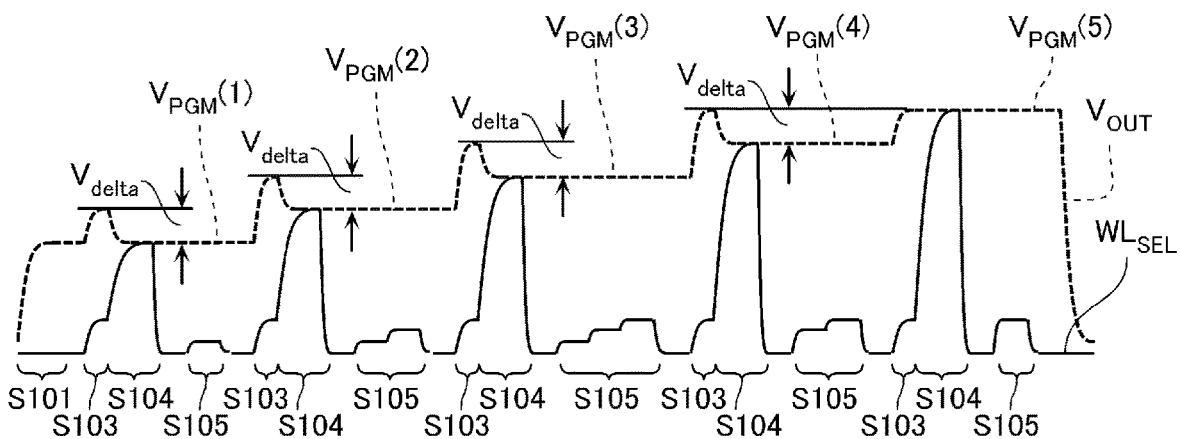
FIG. 14 is a schematic waveform diagram for describing the write operation according to the first embodiment.

As illustrated in FIG. 14, the magnitude of the voltage $V_{delta}$ may be set not to be larger than a predetermined maximum voltage. FIG. 14 illustrates an example in which the program voltage $V_{PGM}(5)$ is the maximum voltage. In the example of FIG. 14, the voltage $V_{OUT}$ of the operating voltage generation unit 31 ($V_{PGM}$) in step S103 when the loop number n is 4 coincides with the maximum voltage. In addition, in step S103 when the loop number n is 5, the voltage $V_{OUT}$ of the operating voltage generation unit 31 ($V_{PGM}$) is increased up to the magnitude of approximately the program voltage $V_{PGM}(5)$.

Figure 15:
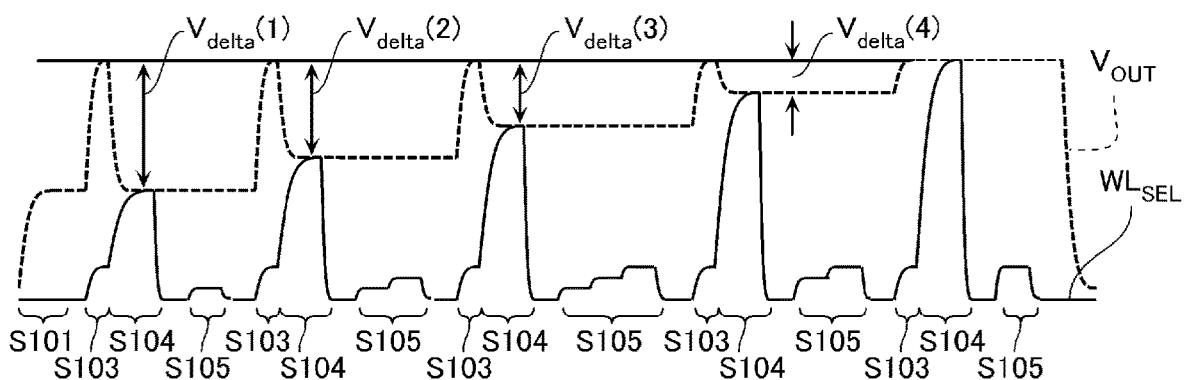
FIG. 15 is a schematic waveform diagram for describing the write operation according to the first embodiment.
Figure 16:
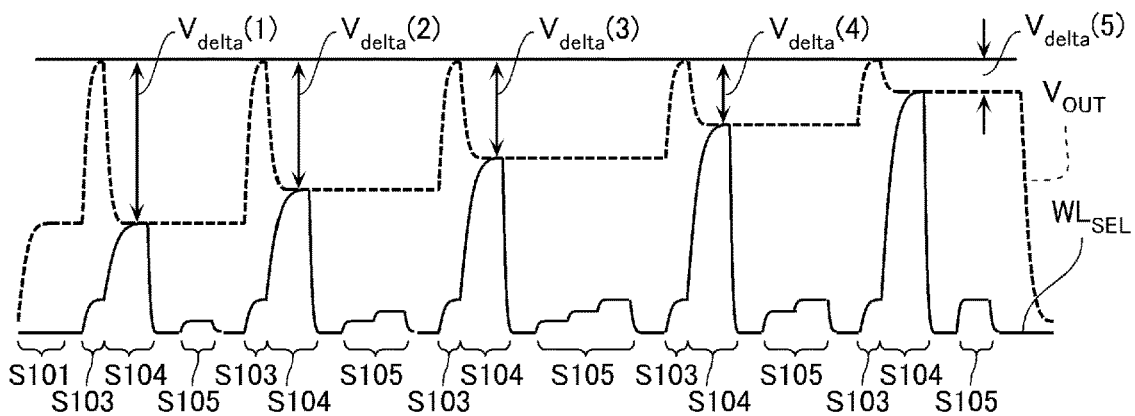
FIG. 16 is a schematic waveform diagram for describing the write operation according to the first embodiment.

As illustrated in FIGS. 15 and 16, the magnitude of the program voltage $V_{PGM}(n)$+the voltage $V_{delta}(n)$ may be constant regardless of the loop number n. FIGS. 15 and 16 illustrate an example in which the magnitude of the program voltage $V_{PGM}(n)$+the voltage $V_{delta}(n)$ is the maximum voltage regardless of the loop number n. Further, in the example of FIG. 15, the program voltage $V_{PGM}(5)$ is the maximum voltage. Further, in the example of FIG. 16, the program voltage $V_{PGM}(5)$ is smaller than the maximum voltage.

Second Embodiment

Figure 17:
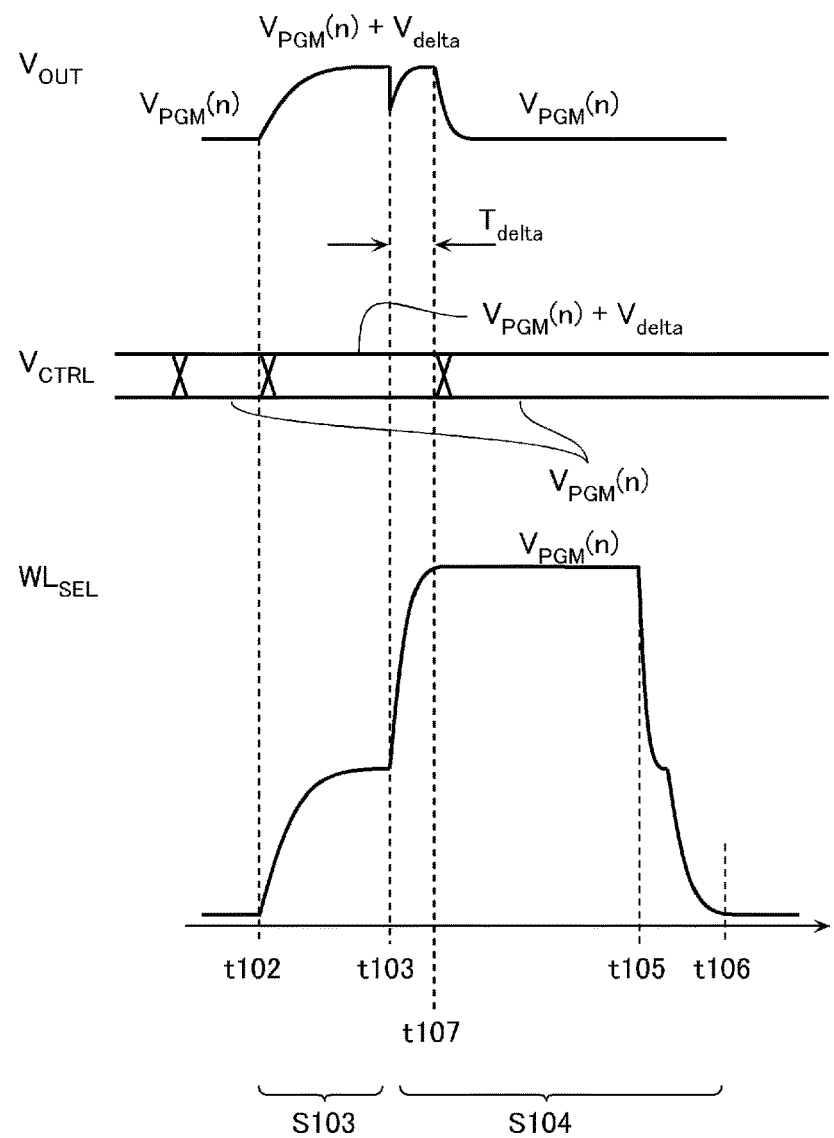
FIG. 17 is a schematic waveform diagram for describing a write operation according to a second embodiment.

FIG. 17 is a schematic waveform diagram for describing a semiconductor memory device according to a second embodiment.

In the first embodiment, as described with reference to FIG. 12, at the timing t103 at which the program operation starts, the value of the operating voltage control signal $V_{CTRL}$ input into the operating voltage generation unit 31 ($V_{PGM}$) is switched to the value corresponding to the program voltage $V_{PGM}(k)$. In this regard, in the embodiment, as illustrated in FIG. 17, from the timing t103 at which the program operation starts to a period $T_{delta}$, the value of the operating voltage control signal $V_{CTRL}$ input into the operating voltage generation unit 31 ($V_{PGM}$) is maintained as the value corresponding to the program voltage $V_{PGM}(k)$+the voltage $V_{delta}$. Thus, in the example of FIG. 17, the voltage $V_{OUT}$ of the operating voltage generation unit 31 ($V_{PGM}$) is increased up to approximately the program voltage $V_{PGM}(k)$+the voltage $V_{delta}$ again. At a timing t107 when the period $T_{delta}$ ends, the value of the operating voltage control signal $V_{CTRL}$ input into the operating voltage generation unit 31 ($V_{PGM}$) is switched to the value corresponding to the program voltage $V_{PGM}(k)$. Along with this, the voltage $V_{OUT}$ of the operating voltage generation unit 31 ($V_{PGM}$) is decreased.

By such a method, a higher-speed write operation may be implemented as compared with the write operation according to the first embodiment.

Even in the write operation according to the second embodiment, the magnitude of the voltage $V_{delta}$ may be adjusted as appropriate similarly to the first embodiment.

[Period $T_{delta}$]

A length of the period $T_{delta}$ is adjusted so that the voltage of the selected word line $WL_{SEL}$ does not become larger than the program voltage $V_{PGM}(k)$. For example, the timing t107 when the period $T_{delta}$ ends, may be set to be earlier than the timing when the voltage of the selected word line $WL_{SEL}$ reaches the program voltage $V_{PGM}(k)$.

Figure 18:
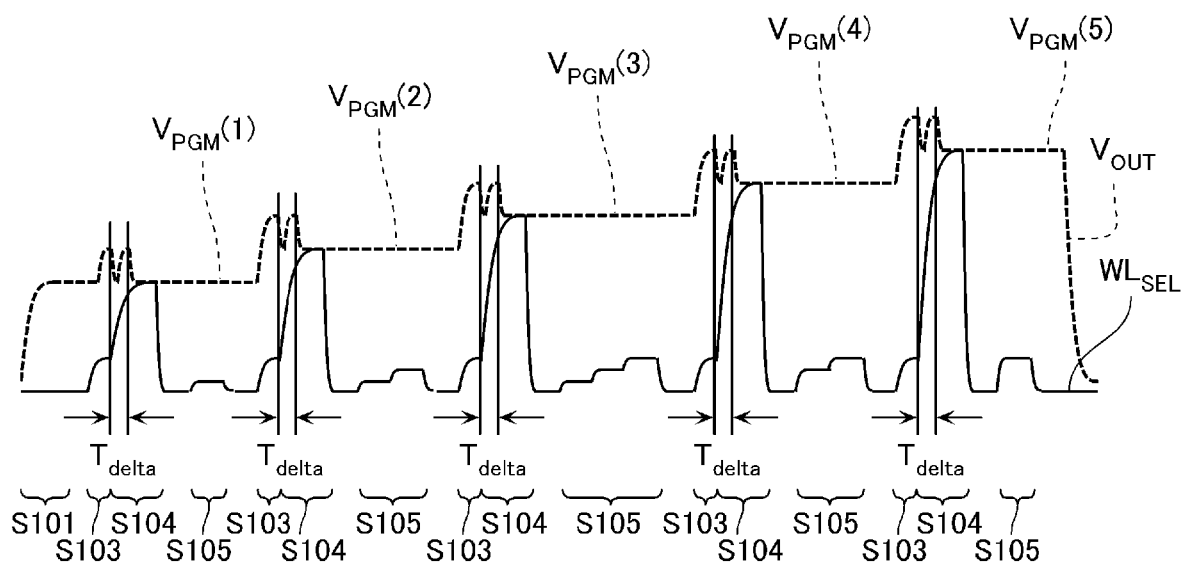
FIG. 18 is a schematic waveform diagram for describing the write operation according to the second embodiment.
Figure 19:
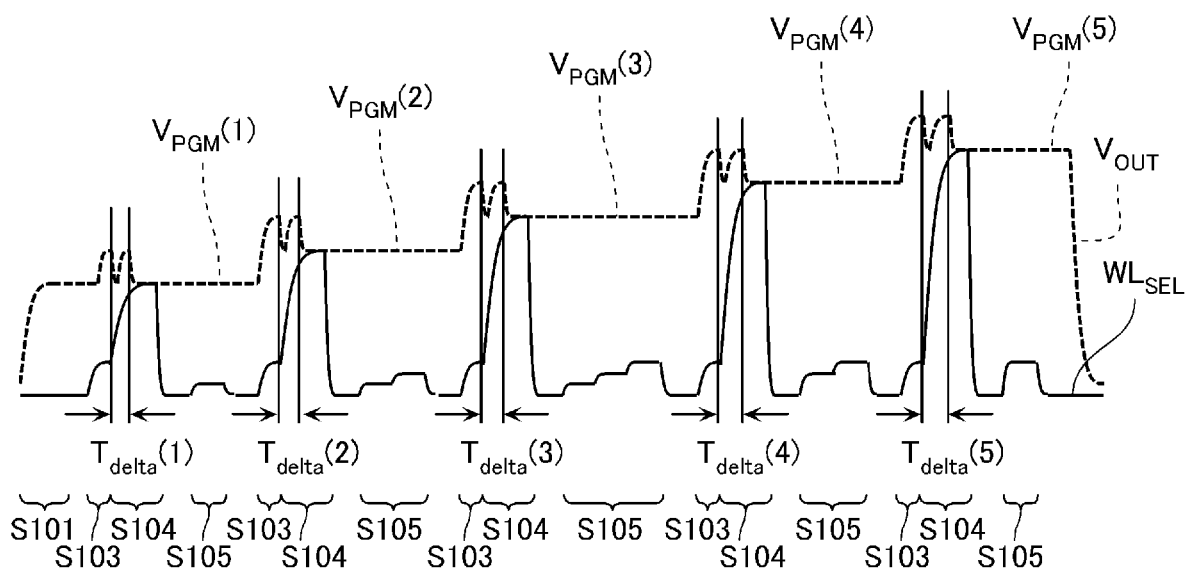
FIG. 19 is a schematic waveform diagram for describing the write operation according to the second embodiment.

In addition, the length of the period $T_{delta}$ of FIG. 17 may be adjusted as appropriate. Hereinafter, this point will be described with reference to FIGS. 18 and 19. FIGS. 18 and 19 are schematic waveform diagrams, and the waveform indicated by the solid line indicates the voltage of the selected word line $WL_{SEL}$ and the waveform indicated by the dotted line indicates the voltage $V_{OUT}$ of the operating voltage generation unit 31 ($V_{PGM}$). Further, FIGS. 18 and 19 illustrate an example in which N of FIG. 11 is 5.

As illustrated in FIG. 18, the length of the period $T_{delta}$ may have a constant magnitude regardless of the loop number n. Further, illustrated in FIG. 19, the length of the period $T_{delta}$ (n) may increase with an increase in loop number n.

Third Embodiment

Figure 20:
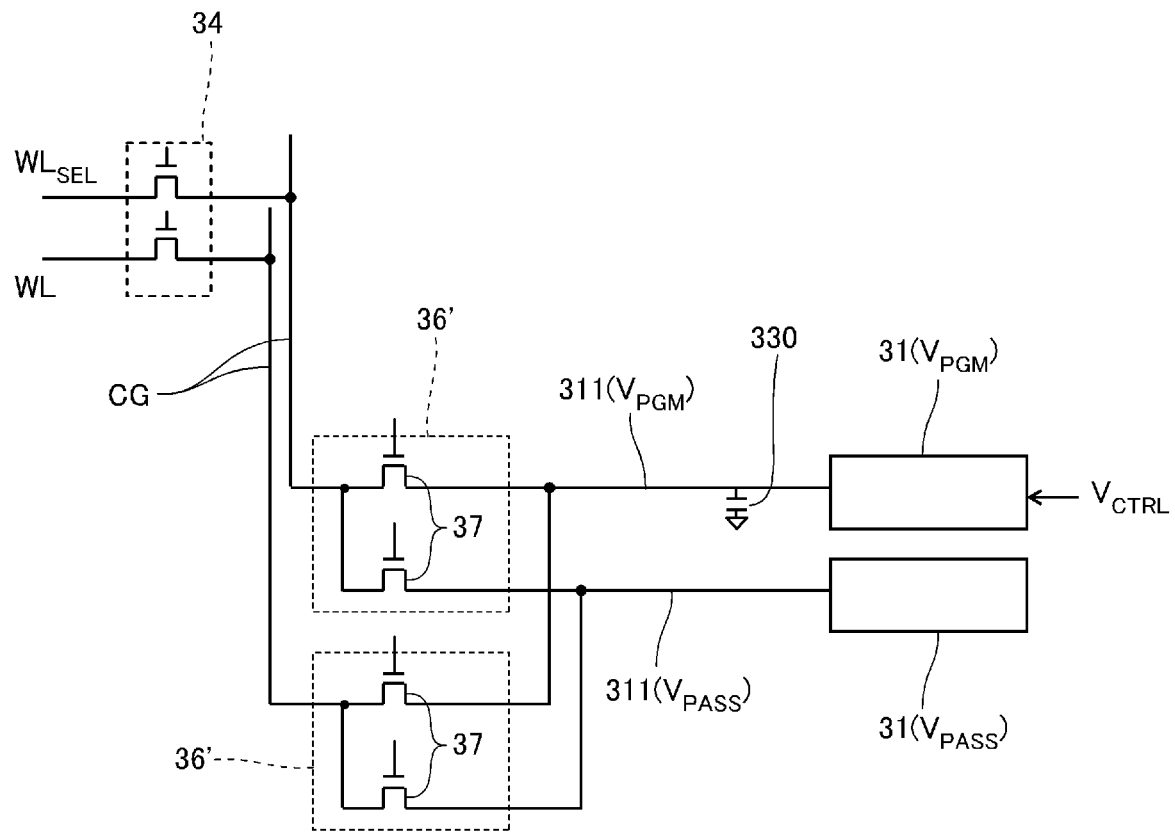
FIG. 20 is a schematic circuit diagram illustrating a configuration of a part of a semiconductor memory device according to a third embodiment.
Figure 21:
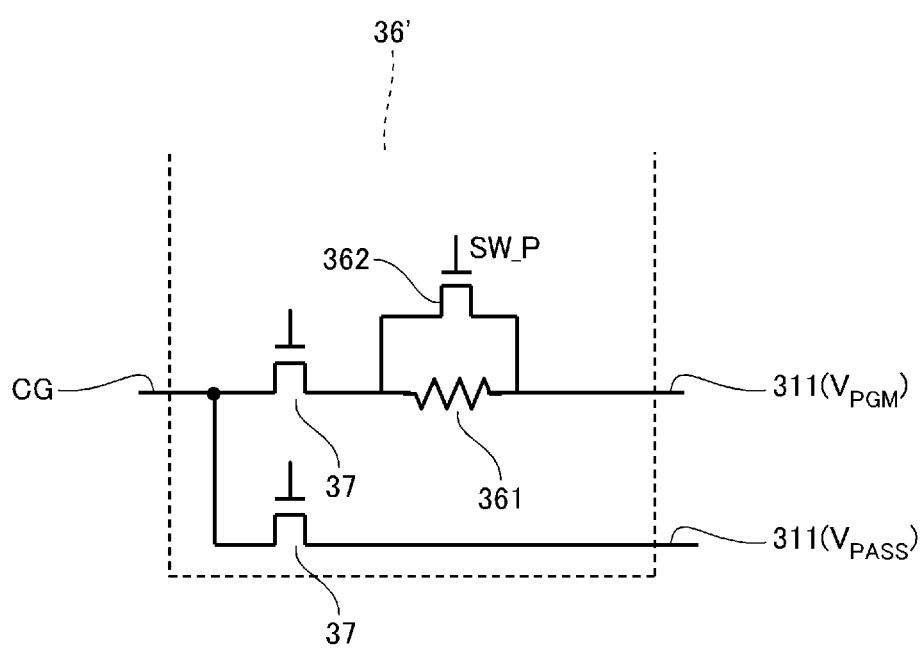
FIG. 21 is a schematic circuit diagram illustrating the configuration of a part of the semiconductor memory device according to the third embodiment.

FIGS. 20 and 21 are schematic circuit diagrams for describing a semiconductor memory device according to a third embodiment.

At what speed the selected word line $WL_{SEL}$ is charged may become non-uniform according to various conditions.

For example, as described with reference to FIG. 5, the semiconductor memory device according to the first embodiment includes two memory cell arrays MCA provided on the substrate 100. Here, depending on the layout of the operating voltage generation unit 31 (FIG. 1), the operating voltage output terminal 311 (FIG. 1), the voltage select circuit 24 (FIG. 1), etc. on the substrate 100, a time required for charging the selected word line $WL_{SEL}$ in the case of executing the write operation to one memory cell array MCA may be longer than that in the case of executing the write operation to the other memory cell array MCA.

For example, the time required for charging the selected word line $WL_{SEL}$ in the case of executing the write operation to both two memory cell arrays MCA may be longer than that in the case of executing the write operation to one memory cell array MCA of two memory cell arrays MCA.

For example, the time required for charging the selected word line $WL_{SEL}$ may be longer as the memory block MB that executes the write operation is disposed at a distance farther from the peripheral circuit PC.

As described with reference to, for example, FIG. 7, the outer diameter of the semiconductor pillar 120 in the XY plane may be different depending on the position in the Z direction. Here, the time required for charging may be longer as the conductive layer 110 faces a portion where the outer diameter of the semiconductor pillar 120 is larger.

Here, so as to perform an appropriate control, in such a case, the charging time of the conductive layer 110 may be made uniform.

Therefore, as illustrated in FIG. 20, in the embodiment, a capacitor 330 is connected between the operating voltage output terminal 311 of the operating voltage generation unit 31 ($V_{PGM}$) and the ground terminal. Thus, non-uniformity of the charging time may be suppressed.

As illustrated in FIG. 21, a voltage select unit 36' according to the embodiment includes a resistance element 361 and a transistor 362 that are connected in parallel between the operating voltage output terminal 311 of the operating voltage generation unit 31 ($V_{PGM}$) and the voltage select transistor 37, and is different from the voltage select unit 36 according to the first embodiment. Further, when it is desired to shorten the charging time according to the various conditions described above, a signal SW_P connected to the gate electrode of the transistor 362 is set to the "H" state in the program operation (step S104 in FIG. 11) and the conductive layer 110 is charged at a high speed. Meanwhile, in other cases, the signal SW_P connected to the gate electrode of the transistor 362 is set to the "L" state in the program operation (step S104 in FIG. 11). Further, the variable resistance element may be used instead of the resistance element 361 and the signal SW_P may be controlled in multiple stages.

The voltage $V_{delta}$ and the length of the period $T_{delta}$ described in the first and second embodiments may be adjusted. That is, when it is desired to shorten the charging time, at least one of the voltage $V_{delta}$ and the period $T_{delta}$ may be set to a comparatively larger value and in other cases, at least one thereof may be set to a comparatively smaller value.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
   a first memory transistor;
   a first wiring connected to a gate electrode of the first memory transistor;
   a first connection transistor having a first end connected to the first wiring; and
   a second wiring connected to a second end of the first connection transistor,
   wherein in a first write operation for the first memory transistor,
   during a first time period while the first connection transistor is OFF, a voltage of the first wiring increases to a first voltage and a voltage of the second wiring increases to a second voltage larger than the first voltage, and
   during a second time period directly after the first time period and directly after the first connection transistor is turned ON, the voltage of the first wiring increases to a third voltage larger than the first voltage and smaller than the second voltage, and the voltage of the second wiring decreases to a fourth voltage larger than the first voltage and smaller than the second voltage.

2. The semiconductor memory device according to claim 1, further comprising:
   a peripheral circuit configured to supply a control voltage to a gate of the first connection transistor,
   wherein a ground voltage and a power supply voltage are supplied to the peripheral circuit, and
   the second voltage, the third voltage, and the fourth voltage are larger than the power supply voltage.

3. The semiconductor memory device according to claim 1, wherein in the first write operation,
   at a beginning of the second time period, the voltage of the first wiring increases and the voltage of the second wiring sharply decreases.

4. The semiconductor memory device according to claim 3, wherein in the first write operation,
   during a third time period after the second time period, the voltage of the first wiring increases to a fifth voltage smaller than the third voltage and the voltage of the second wiring increases to a sixth voltage larger than the fourth voltage, and
   during a fourth time period directly after the third time period, the voltage of the first wiring increases to a seventh voltage larger than the third voltage and smaller than the sixth voltage and the voltage of the second wiring decreases to an eighth voltage larger than the fourth voltage and smaller than the sixth voltage.

5. The semiconductor memory device according to claim 4, wherein the sixth voltage is larger than the second voltage.

6. The semiconductor memory device according to claim 5, wherein a voltage difference between the second voltage and the fourth voltage substantially equal to the voltage difference between the sixth voltage and the eighth voltage.

7. The semiconductor memory device according to claim 4, wherein the second voltage and the sixth voltage are substantially equal.

8. The semiconductor memory device according to claim 1, wherein in the first write operation,
   during the second time period, the voltage of the second wiring decreases to the fourth voltage before the voltage of the first wiring reaches the third voltage.

9. The semiconductor memory device according to claim 1, wherein in the first write operation,
   during the second time period, the voltage of the second wiring decreases initially, and then increases, before decreasing to the fourth voltage.

10. The semiconductor memory device according to claim 9, wherein in the first write operation,
    the first memory transistor is programmed in a plurality of loops at successively higher programming voltages until a verify operation performed on the first memory transistor is a pass, and
    a length of a partial time period at a beginning of the second time period during which the voltage of the second wiring is increasing, is constant with respect to a programming loop number.

11. The semiconductor memory device according to claim 9, wherein in the first write operation,
    the first memory transistor is programmed in a plurality of loops at successively higher programming voltages until a verify operation performed on the first memory transistor is a pass, and
    a length of a partial time period at a beginning of the second time period during which the voltage of the second wiring is increasing, increases in accordance with a programming loop number.

12. A semiconductor memory device comprising:
    a first memory transistor;
    a second memory transistor;
    a first wiring connected to a gate electrode of the first memory transistor;
    a second wiring connected to a gate electrode of the second memory transistor;
    a third wiring;
    a first connection transistor having a first end connected to the first wiring and a second end connected to the third wiring; and
    a second connection transistor having a first end connected to the second wiring and a second end connected to the third wiring,
    wherein in a first write operation for the first memory transistor,
       during a first time period while the first connection transistor is OFF, a voltage of the first wiring increases to a first voltage and a voltage of the third wiring increases to a second voltage larger than the first voltage, and
       during a second time period directly after the first time period and directly after the first connection transistor is turned ON, the voltage of the first wiring increases to a third voltage larger than the first voltage and smaller than the second voltage, and the voltage of the third wiring decreases to a fourth voltage larger than the first voltage and smaller than the second voltage, and
    wherein in a second write operation for the second memory transistor,
       during a third time period while the second connection transistor is OFF, a voltage of the second wiring increases to the first voltage and a voltage of the third wiring increases to a fifth voltage larger than the fourth voltage and smaller than the second voltage, and
       during a fourth time period directly after the third time period and directly after the second connection transistor is turned ON, the voltage of the second wiring increases to the third voltage, and the voltage of the third wiring decreases to the fourth voltage.

13. The semiconductor memory device according to claim 12, further comprising:
- a voltage generation circuit configured to output the first voltage, the second voltage, third voltage, the fourth voltage, and the fifth voltage,
- wherein the first memory transistor is included in a first memory cell array, and the second memory transistor is included in a second memory cell array, and
- wherein the first memory transistor is located farther from the voltage generation circuit than the second memory transistor.

14. The semiconductor memory device according to claim 12, wherein
- the first memory transistor is located at an intersection of a first memory pillar and the first wiring, and the second memory transistor is located at an intersection of a second memory pillar and the second wiring, and
- a diameter of the first memory pillar at a location of the first memory transistor is larger than a diameter of the second memory pillar at a location of the second memory transistor.

15. The semiconductor memory device according to claim 12, further comprising:
- a peripheral circuit configured to supply a control voltage to gates of the first and second connection transistors, wherein a ground voltage and a power supply voltage are supplied to the peripheral circuit, and the second voltage, the third voltage, the fourth voltage, and the fifth voltage are larger than the power supply voltage.

16. A method of performing a write operation in a semiconductor memory device comprising a first memory transistor, a first wiring connected to a gate electrode of the first memory transistor, a first connection transistor having a first end connected to the first wiring, and a second wiring connected to a second end of the first connection transistor, said method comprising:
- while the first connection transistor is OFF, increasing a voltage of the first wiring to a first voltage and increasing a voltage of the second wiring to a second voltage larger than the first voltage;
- turning ON the first connection transistor to increase the voltage of the first wiring from the first voltage to a third voltage, which is smaller than the second voltage; and
- while the voltage of the first wiring is increased from the first voltage to the third voltage, decreasing the voltage of the second wiring from the second voltage to a fourth voltage, which is larger than the first voltage.

17. The method according to claim 16, further comprising:
- generating the fourth voltage and applying the fourth voltage to the second wiring to decrease the voltage of the second wiring from the second voltage to the fourth voltage.

18. The method according to claim 16, wherein the fourth voltage is generated and applied to the second wiring at the same time the first connection transistor is turned ON.

19. The method according to claim 16, wherein the fourth voltage is generated and applied to the second wiring a predetermined time after the first connection transistor is turned ON.

20. The method according to claim 16, wherein the semiconductor memory device further comprises a peripheral circuit configured to supply a control voltage to a gate of the first connection transistor, said method further comprising:
- supplying a ground voltage and a power supply voltage that is less than the second voltage, the third voltage, and the fourth voltage, to the peripheral circuit.

* * * * *